US008835207B2

(12) United States Patent
Arai

(10) Patent No.: US 8,835,207 B2
(45) Date of Patent: Sep. 16, 2014

(54) METHOD OF MANUFACTURING A SEMICONDUCTOR INTEGRATED CIRCUIT DEVICE HAVING A MEMS ELEMENT

(71) Applicant: Renesas Electronics Corporation, Kawasaki (JP)

(72) Inventor: Koichi Arai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/750,615

(22) Filed: Jan. 25, 2013

(65) Prior Publication Data
US 2013/0193536 A1    Aug. 1, 2013

(30) Foreign Application Priority Data

Jan. 30, 2012   (JP) ................................ 2012-016091

(51) Int. Cl.
| H01L 21/02 | (2006.01) |
| B81C 1/00 | (2006.01) |
| B81C 3/00 | (2006.01) |
| H01L 29/84 | (2006.01) |
| H01L 23/48 | (2006.01) |
| B81B 3/00 | (2006.01) |

(52) U.S. Cl.
CPC .......... *B81C 3/00* (2013.01); *B81B 2201/0264* (2013.01); *B81B 3/00* (2013.01); *B81C 2201/056* (2013.01); *B81C 1/00896* (2013.01)

USPC .............. 438/53; 438/50; 438/460; 438/464; 438/613; 438/622; 257/E29.324

(58) Field of Classification Search
USPC ......................... 438/50, 53, 460, 33, 68, 113; 257/E29.324, E21.499
See application file for complete search history.

(56) References Cited

U.S. PATENT DOCUMENTS

| 7,270,012 | B2 | 9/2007 | Yokoyama et al. |
| 7,451,656 | B2 | 11/2008 | Yokoyama et al. |
| 7,670,861 | B2 | 3/2010 | Hanaoka et al. |
| 2006/0237806 | A1* | 10/2006 | Martin et al. ................. 257/415 |
| 2010/0022046 | A1* | 1/2010 | Utsumi et al. ................. 438/51 |

OTHER PUBLICATIONS

Rao R. Tummala,"Fundamentals of Microsystems Packaging", McGraw-Hill, (2001) Chapter 14, pp. 558-559.
Rao R. Tummala & Madhavan Swaminathan,"Introduction to System-on-Package (SOP)", McGraw-Hill (2008) Chapt. 9, pp. 495-532.

* cited by examiner

*Primary Examiner* — Colleen Matthews
*Assistant Examiner* — Regan J Rundio
(74) *Attorney, Agent, or Firm* — Womble Carlyle

(57) ABSTRACT

In a method of manufacturing a semiconductor integrated circuit device having an MEMS element over a single semiconductor chip, the movable part of the MEMS element is fixed before the formation of a rewiring. After formation of the rewiring, the wafer is diced. Then, the movable part of the MEMS element is released by etching the wafer.

10 Claims, 20 Drawing Sheets

METHOD OF MANUFACTURING A SEMICONDUCTOR INTEGRATED CIRCUIT DEVICE HAVING A MEMS ELEMENT

CROSS-REFERENCE TO RELATED APPLICATIONS

The disclosure of Japanese Patent Application No. 2012-016091 filed on Jan. 30, 2012 including the specification, drawings and abstract is incorporated herein by reference in its entirety.

BACKGROUND

The present invention relates to a technique which is effectively applied to an MEMS (Micro Electro Mechanical System) structure protection technology in a method of manufacturing a semiconductor integrated circuit device (or a semiconductor device).

Japanese Unexamined Patent Publication No. 2006-126182 (Patent Document 1) or U.S. Pat. No. 7,451,656 (Patent Document 2) corresponding to this discloses a technology for configuring a pressure sensor with top two layers of a wiring layer after a micro circuit is formed in a method of manufacturing a semiconductor integrated circuit device having an MEMS (Micro Electro Mechanical System) structure such as a pressure sensor.

Japanese Unexamined Patent Publication No. 2007-203420 (Patent Document 3) or U.S. Pat. No. 7,670,861 (Patent Document 4) corresponding to this discloses a technology for configuring an MEMS structure with a material capable of forming the MEMS structure at a low temperature in a method of manufacturing a semiconductor integrated circuit device having the MEMS structure. In this technology, it is proposed that annealing for removing the stress of the MEMS structure should be carried out at a low temperature that does not adversely affect other micro integrated circuit elements.

Rao R. Tummala, "Fundamentals of Microsystems Packaging", McGRAW-HILL, 2001, pp. 558-559 (Non-patent Document 1) gives a description of a method of manufacturing a semiconductor integrated circuit device having an MEMS structure. An approach to release an MEMS element, that is, an approach to make the MEMS element movable before dicing and an approach to release an MEMS element after dicing are described in this document as process strategies for avoiding an adverse effect on the MEMS element by wafer dicing.

Rao R. Tummala & Madhavan Swaminathan, "Introduction to System-on-Package (SOP)", McGRAW-HILL, 2008, pp. 495-532 (Non-patent Documents 2) teaches that WLP (Wafer-level Packaging) system is more advantageous than CSP (Chip-scale Packaging) system in terms of cost and manufacturing efficiency.

RELATED ART DOCUMENTS

Patent Documents

[Patent Document 1]
Japanese Unexamined Patent Publication No. 2006-126182
[Patent Document 2]
U.S. Pat. No. 7,451,656
[Patent Document 3]
Japanese Unexamined Patent Publication No. 2007-203420
[Patent Document 4]
U.S. Pat. No. 7,670,861

[Non-patent Document 1]
Rao R. Tummala, "Fundamentals of Microsystems Packaging", McGRAW-HILL, 2001, pp. 558-559
[Non-patent Document 2]
Rao R. Tummala & Madhavan Swaminathan, "Introduction to System-on-Package (SOP)", McGRAW-HILL, 2008, pp. 495-532

SUMMARY

Needs for MEMS element built-in semiconductor integrated circuit devices having an MEMS element such as an air pressure sensor integrated as part of an integrated circuit chip such as LSI (Large Scale Integration) are growing. In this connection, the processing of the MEMS element after the device is divided into chips may cause a sharp rise in cost. Therefore, to avoid this disadvantage, it is considered that a combination of an ordinary wafer process and a WLP process is effective.

However, in general, the characteristic properties of the MEMS element may be deteriorated by exposure to strong vibration caused by dicing, back grinding (BG) or plating, or exposure to strong light or a chemical liquid in an ordinary method of manufacturing a semiconductor integrated circuit.

It is an object of the present invention to provide a highly reliable method of manufacturing a semiconductor integrated circuit device.

The above and other objects and novel features of the present invention will become apparent from the following description taken in connection with the accompanying drawings.

A brief description is subsequently given of a typical one of the inventions disclosed in the present application.

That is, in one of the inventions of the present application, the movable part of an MEMS element is fixed, i.e., "immobilized", before the formation of a rewiring and released by etching as a wafer process after dicing in the method of manufacturing a semiconductor integrated circuit device having the MEMS element integrated over a single semiconductor chip.

A brief description is subsequently given of an effect obtained by the typical one of the inventions disclosed in the present application.

That is, in the method of manufacturing a semiconductor integrated circuit device having an MEMS element integrated over a single semiconductor chip, the movable part of the MEMS element is fixed before the formation of a rewiring and released by etching as a wafer process after dicing, thereby making it possible to reduce damage to the MEMS element during the rewiring process or the dicing process.

DETAILED DESCRIPTION

[Description of an Embodiment]

Figure 1:
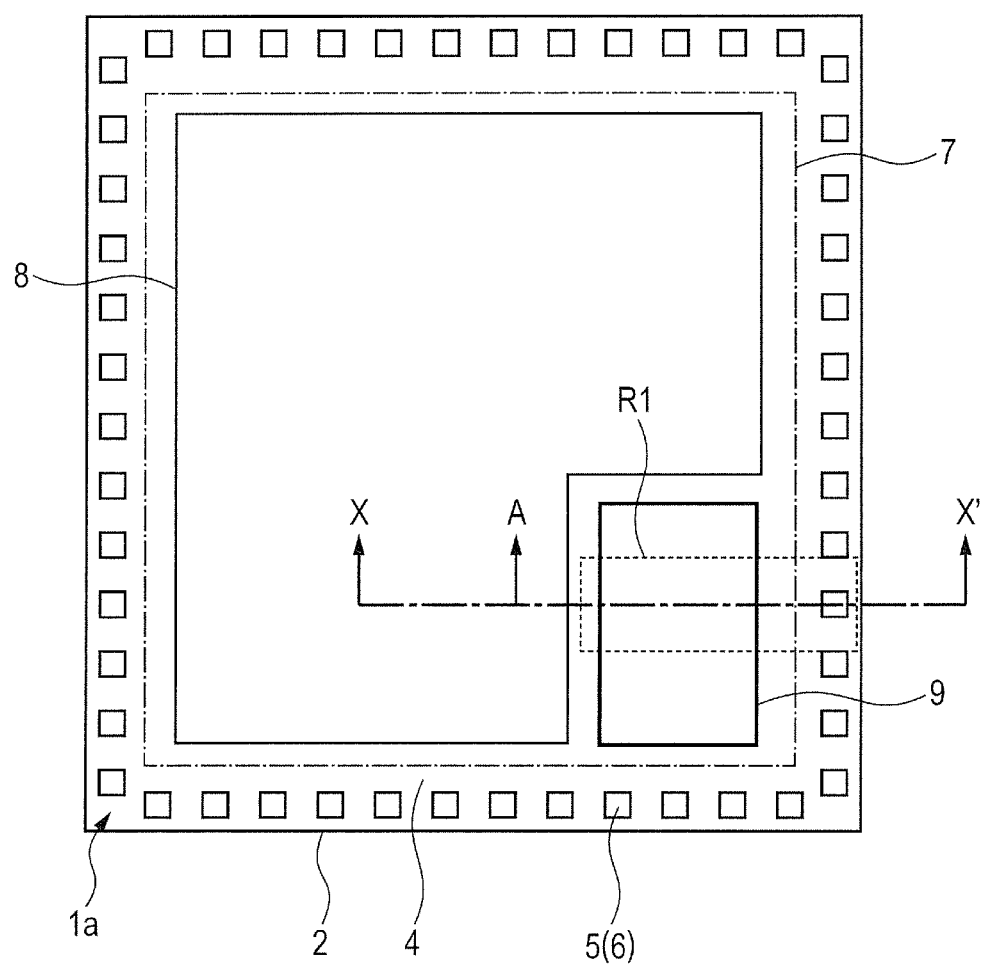
FIG. 1 is a top entire view of a CMOS-LSI chip as an example of a device of interest in the method of manufacturing a semiconductor integrated circuit device according to an embodiment of the present invention.

A description is first given of a typical embodiment of the invention disclosed in the present application.

1. A method of manufacturing a semiconductor integrated circuit device, comprises the steps of: (a) forming a wiring layer and an MEMS element having a movable part over the first main surface of a semiconductor wafer having a first main surface and a second main surface; (b) fixing the movable part of the MEMS element; (c) after the step (b), forming a rewiring layer over the wiring layer over the first main surface of the semiconductor wafer while the movable part of the MEMS element is fixed; (d) after the step (c), dicing the semiconductor wafer while the movable part of the MEMS element is fixed; and (e) after the step (d), releasing the movable part of the MEMS element by etching the first main surface of the semiconductor wafer.

2. In the method of manufacturing a semiconductor integrated circuit device in the above paragraph 1, the step (d) is carried out while the second main surface of the semiconductor wafer is affixed to a dicing tape.

3. In the method of manufacturing a semiconductor integrated circuit device in the above paragraph 2, the step (e) is carried out while the second main surface of the semiconductor wafer is affixed to a dicing tape.

4. In the method of manufacturing a semiconductor integrated circuit device in any one of the above paragraphs 1 to 3, the MEMS element is an air pressure sensor.

5. In the method of manufacturing a semiconductor integrated circuit device in any one of the above paragraphs 1 to 4, the MEMS element is formed to have the following components: (x1) a lower electrode formed over the first main surface of the semiconductor wafer; (x2) a cavity formed over the lower electrode; (x3) a diaphragm type upper electrode formed to cover the cavity over the first main surface of the semiconductor wafer; and (x4) a diaphragm cover for isolating the diaphragm type upper electrode from the outside world.

6. In the method of manufacturing a semiconductor integrated circuit device in the above paragraph 5, the step (b) is carried out by covering vents formed in the diaphragm cover with a protective film.

7. In the method of manufacturing a semiconductor integrated circuit device in the above paragraph 5 or 6, the step (e) is carried out by opening the vents formed in the diaphragm cover.

8. In the method of manufacturing a semiconductor integrated circuit device in the above paragraph 7, the vents formed in the diaphragm cover are opened by etching the protective film over the first main surface of the semiconductor wafer while the second main surface of the semiconductor wafer is affixed to the dicing tape.

9. The method of manufacturing a semiconductor integrated circuit device in any one of the above paragraphs 1 to 8, further comprises the step of: (b1) after the step (b) and before the step (c), grinding the second main surface of the semiconductor wafer.

10. The method of manufacturing a semiconductor integrated circuit device in any one of the above paragraphs 1 to 8 further comprises the step of: (c-d1) after the step (c) and before the step (e), grinding the second main surface of the semiconductor wafer.

[Explanation of the Description Format, Basic Terms and Usage Thereof in the Present Application]

1. In the present application, an embodiment may be described in a plurality of sections as required for convenience sake, and these sections are not independent from one another but are for a single example, that is, some sections are for partial details of the other sections, or for some or all of modifications, except when it is clearly stated that they are not. Basically, a repetition of the same part is omitted. Constituent elements in the embodiment are nonessential except when it is clearly stated that they are not, when the number thereof is theoretically limited to the mentioned number and when it is clearly understood from the context that they are not.

Further, in the present application, by the term "semiconductor device" or "semiconductor integrated circuit device" is mainly understood a device which has transistors (active elements), and resistors and capacitors arranged around the transistors, all of which are integrated over a semiconductor chip (such as a monocrystal silicon substrate). Typical examples of the transistors include MISFET's (Metal Insulator Semiconductor Field Effect Transistors) typified by MOSFET's (Metal Oxide Semiconductor Field Effect Transistors). CMIS (Complementary Metal Insulator Semiconductor) integrated circuits typified by CMOS (Complementary Metal Oxide Semiconductor) integrated circuits which are each a combination of an N channel MISFET and a P channel MISFET are typical examples of the integrated circuit configuration.

A wafer process for a semiconductor integrated circuit device of today, that is, LSI (Large Scale Integration) is roughly divided into a FEOL (Front End of Line) step from the installation of a silicon wafer as a raw material up to a premetal step (the step including the formation of an interlayer insulating film between the lower end of an M1 wiring layer and a gate electrode structure, the formation of contact holes and the embedding of a tungsten plug) and a BEOL (Back End of Line) step from the formation of an M1 wiring layer up to the formation of a pad opening in a final passivation film over an aluminum-based pad electrode (including this step in a wafer level packaging process).

2. Similarly, in the description of the embodiment, as for materials and composition, the expression "X including A" does not exclude X including an element other than A as one of the main constituent elements except when it is clearly stated that it is not and when it is obvious from the context that it is not. For instance, it means that "X includes A as the main component". For example, it is needless to say that the expression "silicon member" is not limited to pure silicon but includes a member containing a SiGe alloy or a poly-element alloy containing silicon as the main component and other additives. Similarly, it is needless to say that the expression "silicon oxide film" or "silicon oxide-based insulating film" includes not only a relatively pure undoped silicon dioxide film but also thermally oxidized films such as FSG (Fluorosilicate Glass), TEOS-based silicon oxide, SiOC (silicon Oxicarbide), carbon-doped silicon oxide, OSG (Organosilicate Glass), PSG (Phosphorus Silicate Glass) and BPSG (Borophosphosilicate Glass) films, CVD oxidized films, coating type silicon oxide films such as SOG (Spin ON Glass) and nano-clustering silica (NCS) films, silica-based Low-k insulating films (porous insulating films) in which pores are introduced into the same member as these and composite films containing any one of these as the main constituent element and another silicon-based insulating film.

A silicon nitride-based insulating film is a silicon-based insulating film which is commonly used in the field of semiconductors like the silicon oxide-based insulating film. The materials used in the silicon-based insulating film include SiN, SiCN, SiNH and SiCNH. The expression "silicon nitride" includes both SiN and SiNH except when it is clearly stated that it is not. Similarly, the expression "SiCN" includes both SiCN and SiCNH except when it is clearly stated that it is not.

Although SiC has similar properties to those of SiN, SiON films should be rather classified into silicon oxide-based insulating films in most cases.

The silicon nitride film is often used as an etch-stop film, that is, CESL (Contact Etch-Stop Layer) in a SAC (Self-Aligned Contact) technique and also used as a stress providing film in SMT (Stress Memorization Technique).

3. Similarly, preferred examples are given for figures, positions and attributes. It is needless to say that the present invention is not limited to these strictly except when it is clearly stated that they are not and when it is obvious from the context that they are not.

4. Further, when a specific numerical value or a specific numerical quantity is mentioned, a numerical value larger than the specific numerical value or a numerical value smaller than the specific numerical value is acceptable except when it is clearly stated that it is not, when the present invention is limited to the value theoretically and when it is obvious from the context that it is not.

5. Although the term "wafer" denotes a monocrystal silicon wafer over which a semiconductor integrated circuit device (the same as a semiconductor device or an electronic device) is to be formed, it is needless to say that it includes a composite wafer including an insulating substrate such as an epitaxial wafer, SOI substrate or LCD glass substrate and a semiconductor layer.

6. In the present application, the term "MEMS element" denotes a micro element having a movable part and electric-mechanical composite device formed by a similar process to the integrated circuit manufacturing process. Examples thereof include sensors such as air pressure sensors, pressure sensors, acceleration sensors, gyros and stress sensors, and actuators and transducers.

The term "movable part" of the MEMS element denotes a part which takes motion such as displacement, vibration, transformation or rotation in connection with the function of the MEMS element.

Similarly, the term "cavity" of the MEMS element denotes an intentionally formed cavity which is a structure serving to enable the motion of the movable part.

Further, the term "diaphragm" of the MEMS element denotes a kind of movable part which configures a thin film-like partition. The term "diaphragm cover" denotes a cover for protecting the diaphragm from the outside world, and an air pressure sensor or pressure sensor generally has vents communicating with the outside world.

Further, the expression "fixing" of the movable part means that the movable part is prevented from being moved substantially by a disturbance from the outside. Therefore, this includes not only the direct fixing of the movable part itself but also the fixing of another part to prevent drive force from being applied to the movable part.

In contrast to this, the expression "release" of the movable part means that a restraint for fixing the movable part is released.

7. In the present invention, the term "wiring layer" denotes an ordinary wiring layer (generally a wiring layer consisting of multiple layers) such as an aluminum ordinary wiring, a tungsten embedded wiring or a copper embedded wiring (including an aluminum-based, tungsten-based or copper-based uppermost pad layer) formed over the premetal layer and the process thereof corresponds to a BEOL step. The term "rewiring layer" denotes a wiring layer having a copper-based wiring formed over the uppermost layer of the wiring layer (ordinary wiring layer) and couples the uppermost wiring layer of the wiring layer to an electrode pad over the rewiring layer.

8. In the present application, the semiconductor manufacturing process is divided into a "wafer process" in which a wafer is processed and a "chip process" in which an individual chip is processed. Since chips are individually processed in the die bonding step, the die bonding step belongs to the chip process. That is, the die bonding step et seq. is a chip process. The dicing step (BG step in the dicing precedence GP step) belongs to the wafer process from the viewpoint of processing because the chips are treated like the wafer as the chips have almost the same positional relationship (the same even when they are expanded) as that of the wafer before they are detached when dicing (for example, full cutting) is completed. Therefore, the step from the injection of a water to the dicing step (BG step in the dicing precedence BG step) is the wafer process.

[Details of Embodiment]

A detailed description is given of the embodiment. In the figures, the same or similar parts are given the same or similar symbols or reference numbers, In the accompanying drawings, hatching may be omitted even in the case of a sectional view when it becomes complicated or when demarcation from a space is clear. In this connection, when it is obvious from an explanation, even in the case of a planarly closed hole, the outlines of the background may be omitted. Further, even when the drawing is not a sectional view, to make it clear that it is not a space, it may be hatched.

Section 1. Explanation of an Example of a Device of Interest in the Method of Manufacturing a Semiconductor Integrated Circuit Device According to an Embodiment of the Present Invention (Mainly from FIG. 1 to FIG. 4)

Although a general integrated circuit region 8 and an MEMS element region 9 are planarly completely separated from each other in the following example, it is needless to say that the MEMS element region 9 may be overlapped with the general integrated circuit region 8. When they are separated from each other, their mutual effect can be reduced. When they are overlapped with each other, the chip area can be cut down. In FIG. 1, pads and bump electrodes are formed only in a chip peripheral region 4 to avoid troublesome chores. They are often formed in a chip inside region 7 actually.

Figure 2:
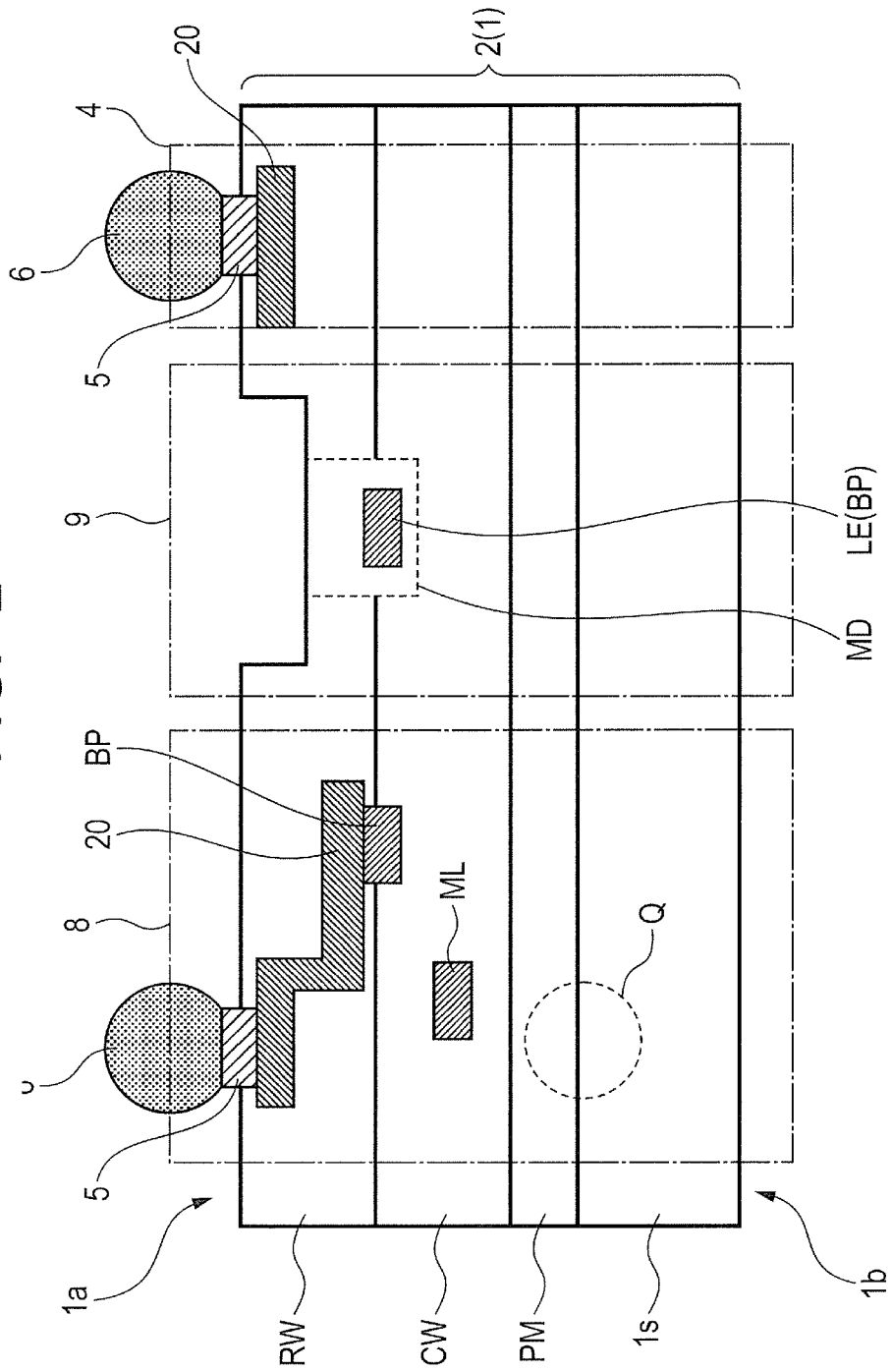
FIG. 2 is a schematic chip sectional view taken on line X-X' of FIG. 1.
Figure 3:
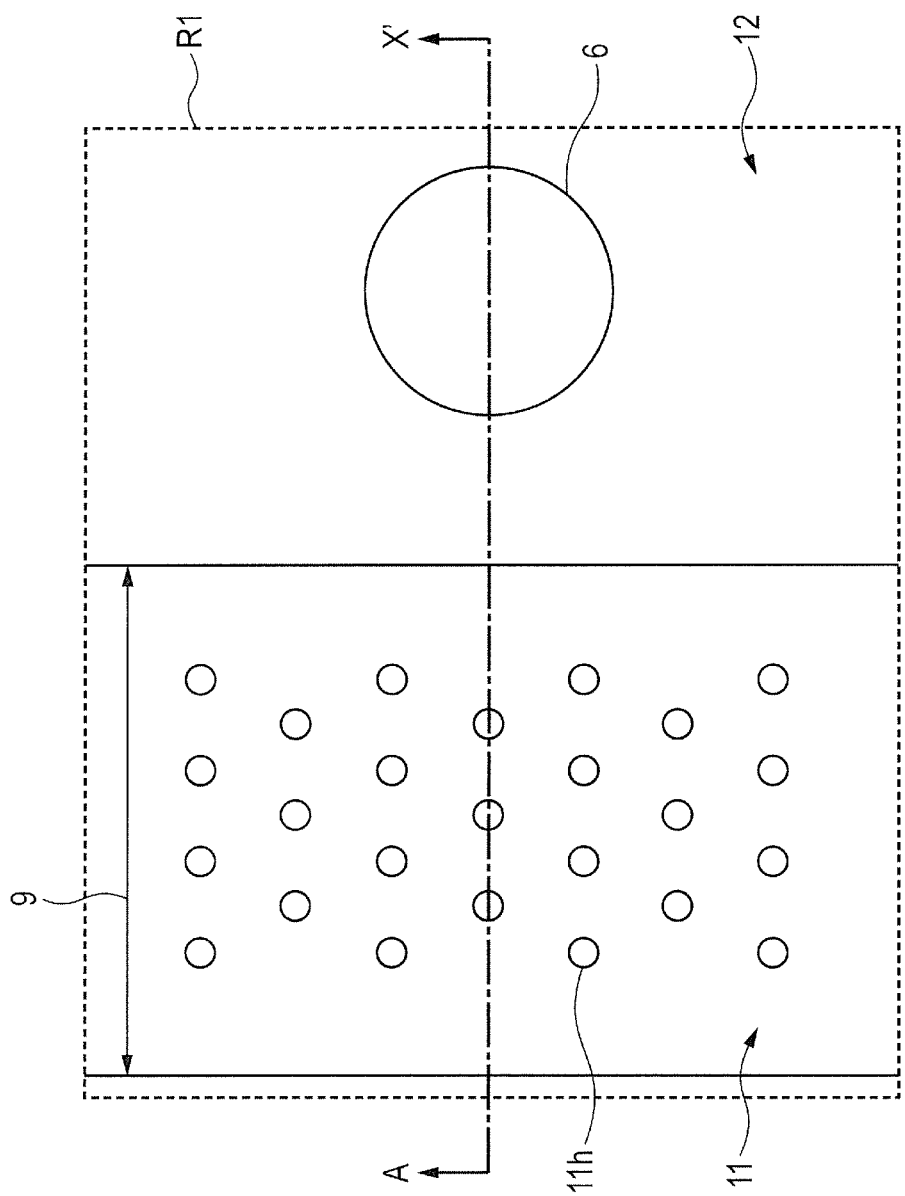
FIG. 3 is an enlarged top view of an MEMS element region 9 and a chip peripheral region 4 adjacent to the region 9 of FIG. 1.
Figure 4:
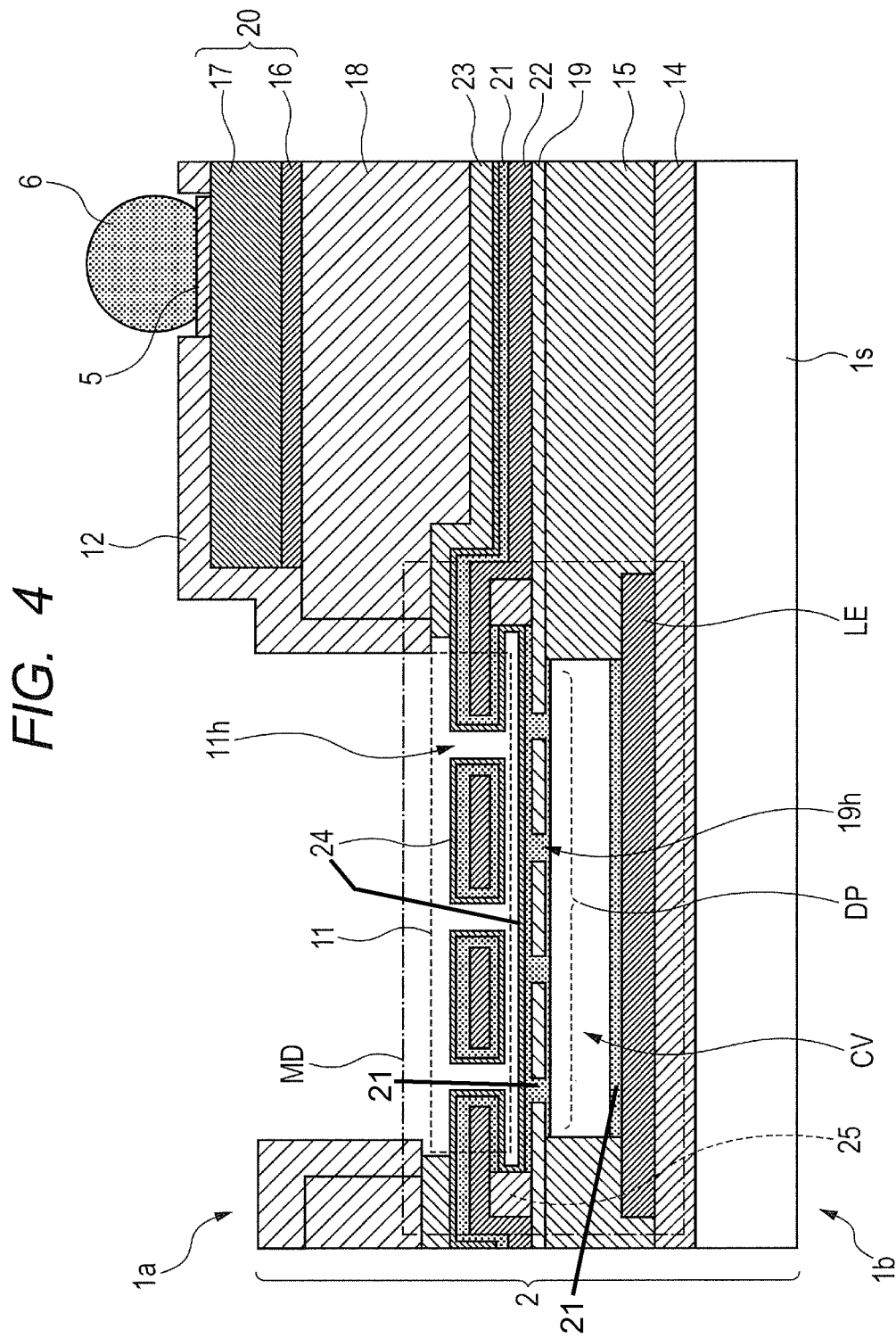
FIG. 4 is a chip sectional view taken on line A-X' of FIG. 3.

FIG. 1 is a top entire view of a CMOS-LSI chip which is an example of a device of interest in the method of manufacturing a semiconductor integrated circuit device according to the embodiment of the present invention. FIG. 2 is a chip sectional view taken on line X-X' of FIG. 1. FIG. 3 is an enlarged top view of the MEMS element region 9 and the chip peripheral region 4 adjacent to the MEM device region 9 of FIG. 1. FIG. 4 is a chip sectional view taken on line A-X' of FIG. 3. A description is subsequently given of an example of a device of interest in the method of manufacturing a semiconductor integrated circuit device according to the embodiment of the present invention with reference to these figures.

As shown in FIG. 1, the device surface 1a (first main surface) of, for example, a silicon-based semiconductor chip 2 is divided into the chip peripheral region 4 and the chip inside region 7. A large number of under bump electrode pads 5, that is, under bump metal (UBM) and a large number of bump electrodes 6 such as solder bumps are formed in the chip peripheral region 4. The bump electrodes 6 may be gold bumps instead of solder bumps. A preferred example of the solder bump is a lead-free solder bump.

The chip inside region 7 has, for example, the general integrated circuit region 8 in which CMOS integrated circuits are arranged and the MEMS element region 9 in which an MEMS element (MEMS structure) such as an air pressure sensor is arranged.

Then, the X-X' section of FIG. 1 is schematically shown in FIG. 2. As shown in FIG. 2, a monocrystal silicon substrate is (wafer or chip substrate) is, for example, a P type monocrystal silicon substrate, and a premetal layer PM for storing the gate structure of MISFET(Q) is formed over the device surface 1a (opposite side to the rear surface 1b).

A wiring layer CW (ordinary wiring layer) which is mainly formed of a copper-based embedded wiring is formed over the premetal layer PM. A rewiring layer RW is further formed over the wiring layer CW. The under bump electrode pads 5 are formed in the uppermost layer of this rewiring layer RW, and the bump electrodes 6 are formed over the under bump electrode pads 5.

An interlayer dielectric (ILD) which is part of the wiring layer CW is, for example, a porous Low-k insulating film (such as a porous SiOC film). The uppermost layer wiring of the wiring layer CW corresponds to an electrode pad BP (part of which may be used as a wiring) and is formed of, for example, an aluminum-based metal layer (non-embedded wiring). This uppermost layer wiring (pad layer) may be formed of a copper-based embedded wiring. This pad layer may be used not as a pad forming layer but merely as the uppermost wiring layer of the wiring layer CW. A wiring ML below the electrode pad BP is generally formed of a copper-based embedded wiring. The wiring ML below the electrode pad BP may be a non-embedded wiring formed of an aluminum-based metal film. The wiring ML below the electrode pad BP may be formed in the general integrated circuit region 8 and also in the MEMS element region 9 and the chip peripheral region 4.

For example, the electrode pad BP in the general integrated circuit region 8 (may be another region) is coupled to the under bump electrode pad 5 through the rewiring metal film 20. This is utterly the same for the under bump electrode pad 5 in the chip peripheral region 4 (cannot be seen on this sectional view of FIG. 2).

In the MEMS element region 9, the aluminum-based metal film which is the same layer as the electrode pad BP as the uppermost wiring layer of the wiring layer CW is used as the lower electrode LE of an MEMS element MD (air pressure sensor).

Then, an enlarged top view of a cut-out region R1 such as the MEMS element region of FIG. 1 is shown in FIG. 3 (for the convenience of illustration, parts or directions irrelevant to the explanation are reduced in size), and the A-X' section is shown in FIG. 4. As shown in FIG. 3 and FIG. 4, an over substrate insulating film 14 including a wiring layer (mainly a silicon oxide-based insulating film) is formed over the device surface 1a of the substrate is of the chip 2, and the lower electrode LE of the MEMS element MD (capacitive air pressure sensor) is formed over the insulating film 14.

A wiring uppermost layer insulating film 15 (mainly a silicon oxide-based insulating film) is formed over the over substrate insulating film 14, and the cavity CV of the MEMS element MD is formed in the insulating film 15. A diaphragm metal film 19 (such as a tungsten film) which functions as the diaphragm type upper electrode DP (diaphragm for measuring air pressure) of the MEMS element MD is formed over the wiring uppermost layer insulating film 15, and apertures 19h are formed above the cavity CV. The shape and arrangement of the apertures 19h are almost the same as those of vents 11h shown in FIG. 3. However, in this example, they differ in size for the convenience of the process and the diameter of the aperture 19h is equal to or smaller than the diameter of the vent 11h.

A sacrificial silicon oxide film 25 which will be described hereinafter is located over the diaphragm metal film 19 near both ends of the cavity CV, and an inside plasma silicon nitride film 22 which functions as the diaphragm cover 11 of the MEMS element MD covers almost the top layer of the sacrificial silicon oxide film 25. The vents 11h are formed above the cavity CV in the inside plasma silicon nitride film 22.

A lower layer backfilling silicon oxide film 21 covers the surface of the inside plasma silicon nitride film 22 and both sides of the exposed diaphragm metal film 19 (including the insides of the apertures 19h) to fill the apertures 19h of the diaphragm metal film 19 and provide mechanical reinforcement. This lower layer backfilling silicon oxide film 21 also covers the top surface of the lower electrode LE below the under surface of the cavity CV.

Further, the lower layer backfilling silicon oxide film 21 gives strength to the diaphragm cover 11 by covering the top surface of the inside plasma silicon nitride film 22 and other exposed parts.

The top surface of the inside plasma silicon nitride film 22 and other exposed parts are covered by an outside plasma silicon nitride film 24. This is aimed to increase humidity resistance. This outside plasma silicon nitride film 24 is also formed over the top surface of the lower layer backfilling silicon oxide film 21 configuring the diaphragm type upper electrode DP and contributes to the airtightness of the cavity CV.

An upper layer backfilling silicon oxide film 23 is formed over the outside plasma silicon nitride film 24 except a portion above the cavity CV (that is, an opening above the MEMS element), and a rewiring layer organic interlayer insulating film 18 (for example, an organic insulating film such as a polyimide-based coating insulating film) is formed over the silicon oxide film 23. This functions as an interlayer insulating film for the rewiring layer.

A rewiring metal film 20 is formed over the rewiring layer organic interlayer insulating film 18 and includes, for example, a rewiring base metal film 16 as a lower layer (for example, consisting of a chromium film as a lower layer and a copper seed film as an upper layer) and a rewiring main metal film 17 as an upper layer (for example, consisting of a copper film as a lower layer and a nickel film as an upper layer).

An under bump electrode pad 5 is formed over the rewiring metal film 20, and a bump electrode 6 is formed over the under bump electrode pad 5. Further, an organic final passivation film 12 (for example, an organic insulating film such as a polyimide-based coating insulating film) covers the major surface portion excluding an opening above the MEMS element and the under bump electrode pad 5.

Section 2. Explanation of Key Process in the Method of Manufacturing a Semiconductor Integrated Circuit Device According to the Above Embodiment of the Present Invention (Mainly FIG. 5, FIG. 6 and FIG. 7 to FIG. 16)

An example in which an aluminum-based pad layer which is the uppermost layer of the wiring layer is used as the lower electrode of the MEMS element (specifically, an air pressure sensor) will be explained herein. However, as the material of the lower electrode, the materials of a gate electrode such as a polysilicon-based gate electrode, a metal gate electrode, a tungsten wiring film, a copper wiring film and other conductive films may be used. The process can be simplified by using an aluminum-based pad layer which is the uppermost layer of the wiring layer.

Figure 5:
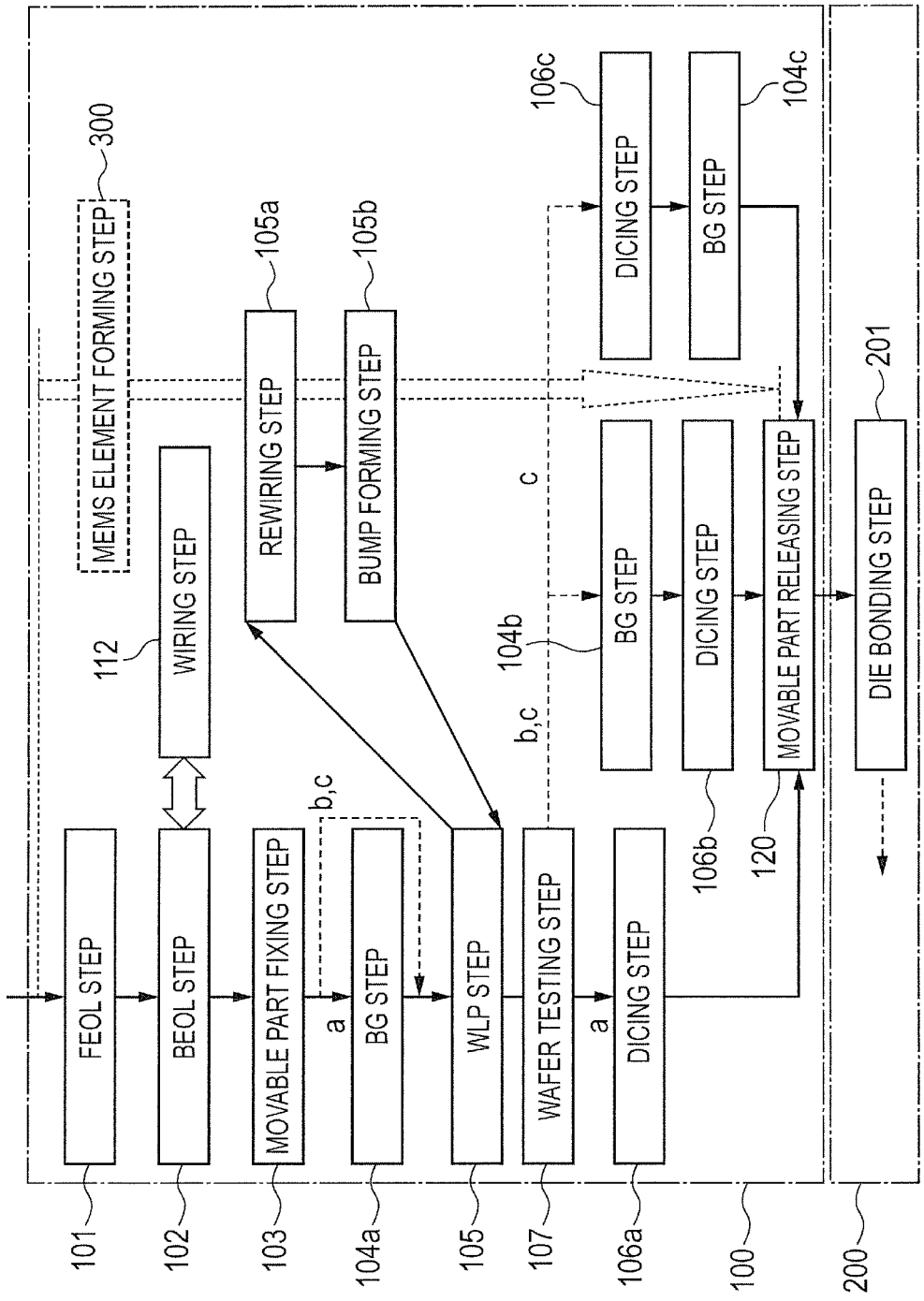
FIG. 5 is a process block flow chart for explaining the key process in the method of manufacturing a semiconductor integrated circuit device according to the above embodiment of the present invention.
Figure 6:
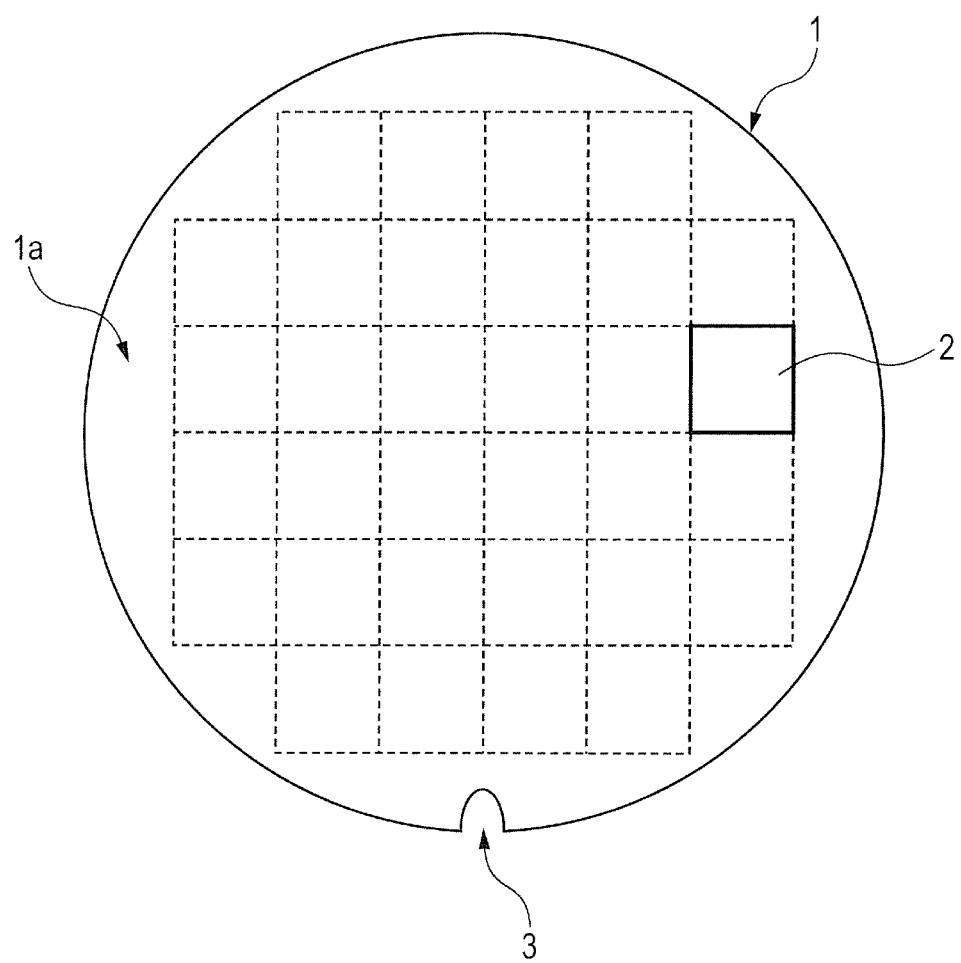
FIG. 6 is a top entire view of a wafer showing the status of the device surface of the wafer in the wafer process before the dicing step of FIG. 5.
Figure 7:
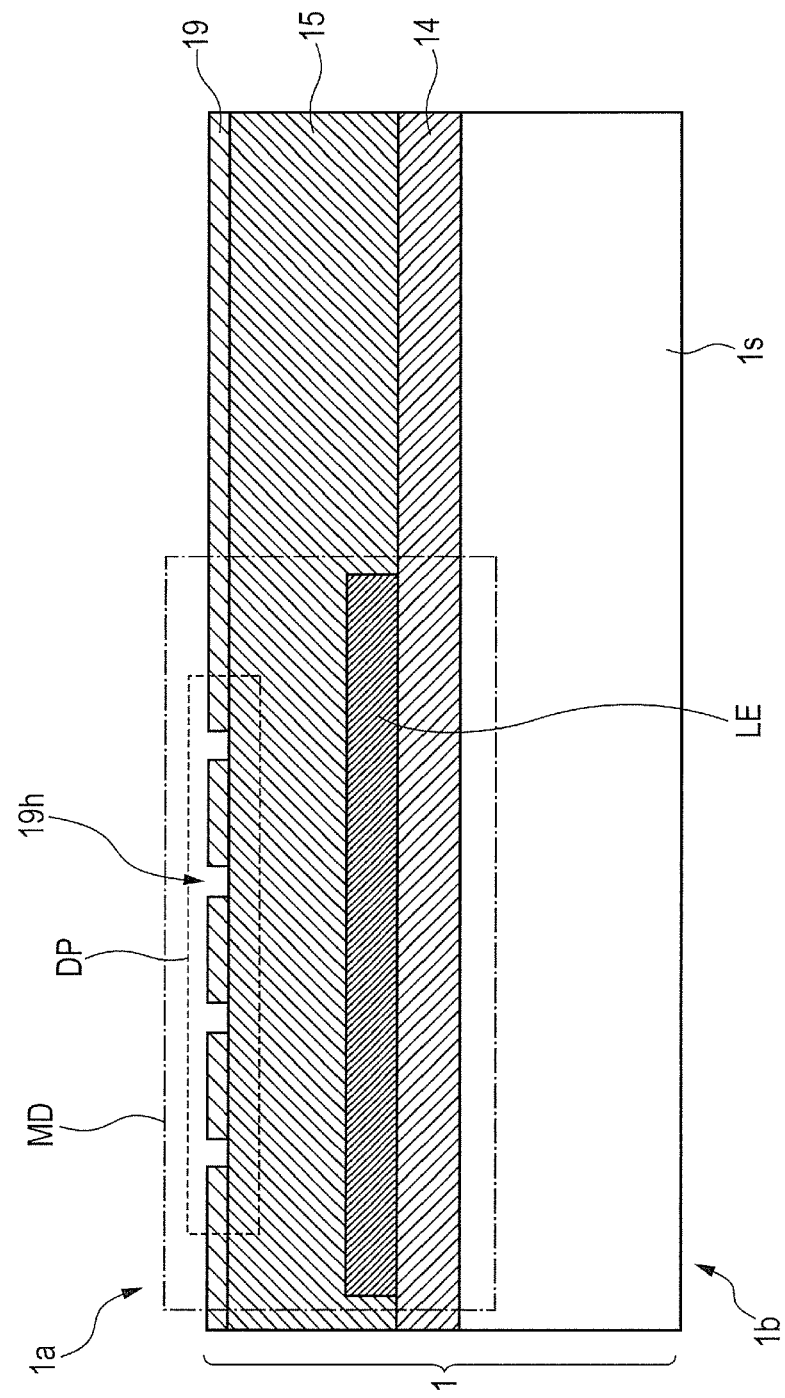
FIG. 7 is a device sectional view of a portion corresponding to FIG. 4 during the manufacturing process (the step of forming apertures in a diaphragm metal film)
Figure 8:
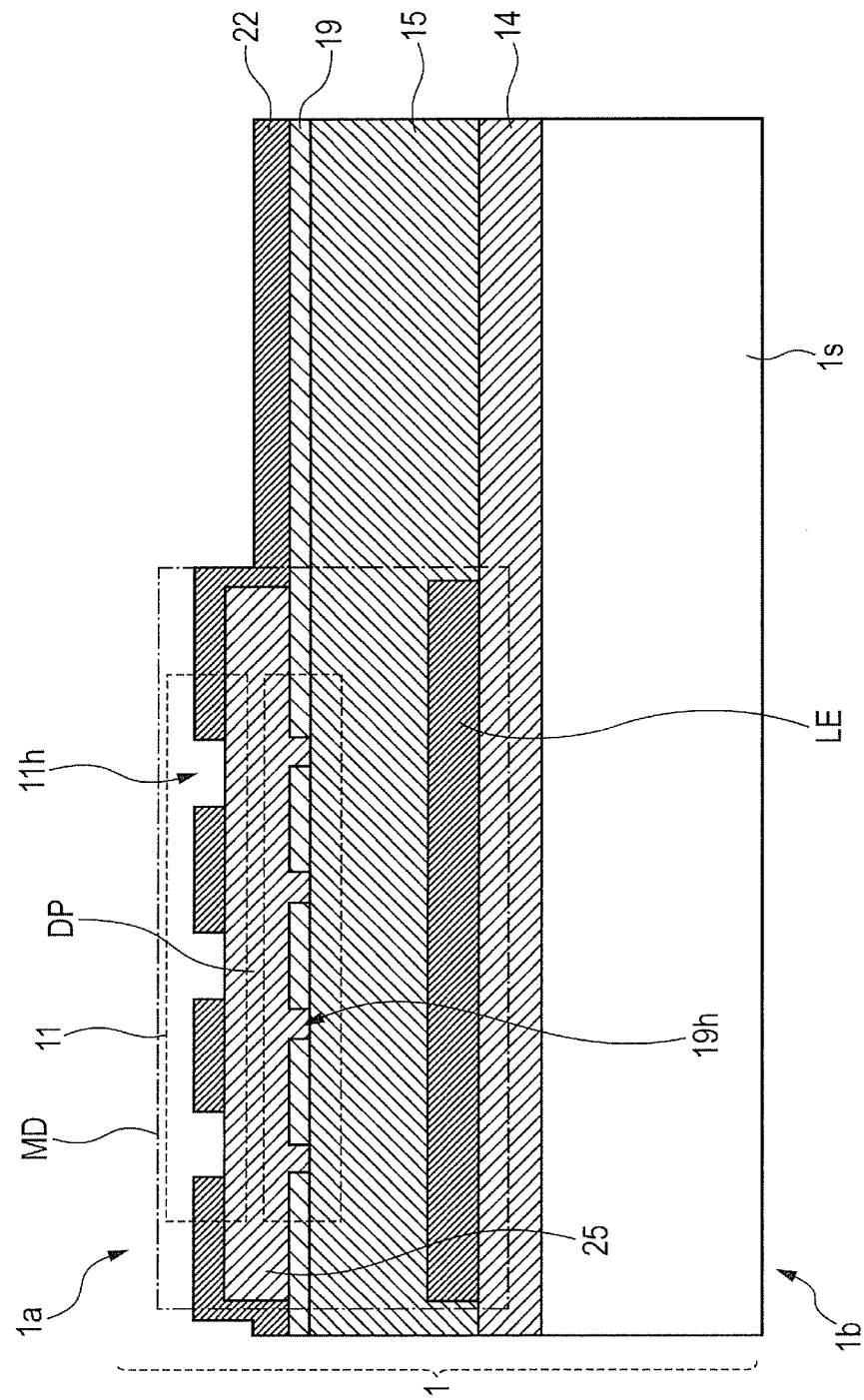
FIG. 8 is a device sectional view of a portion corresponding to FIG. 4 during the manufacturing process (step of forming vents in a diaphragm cover)
Figure 9:
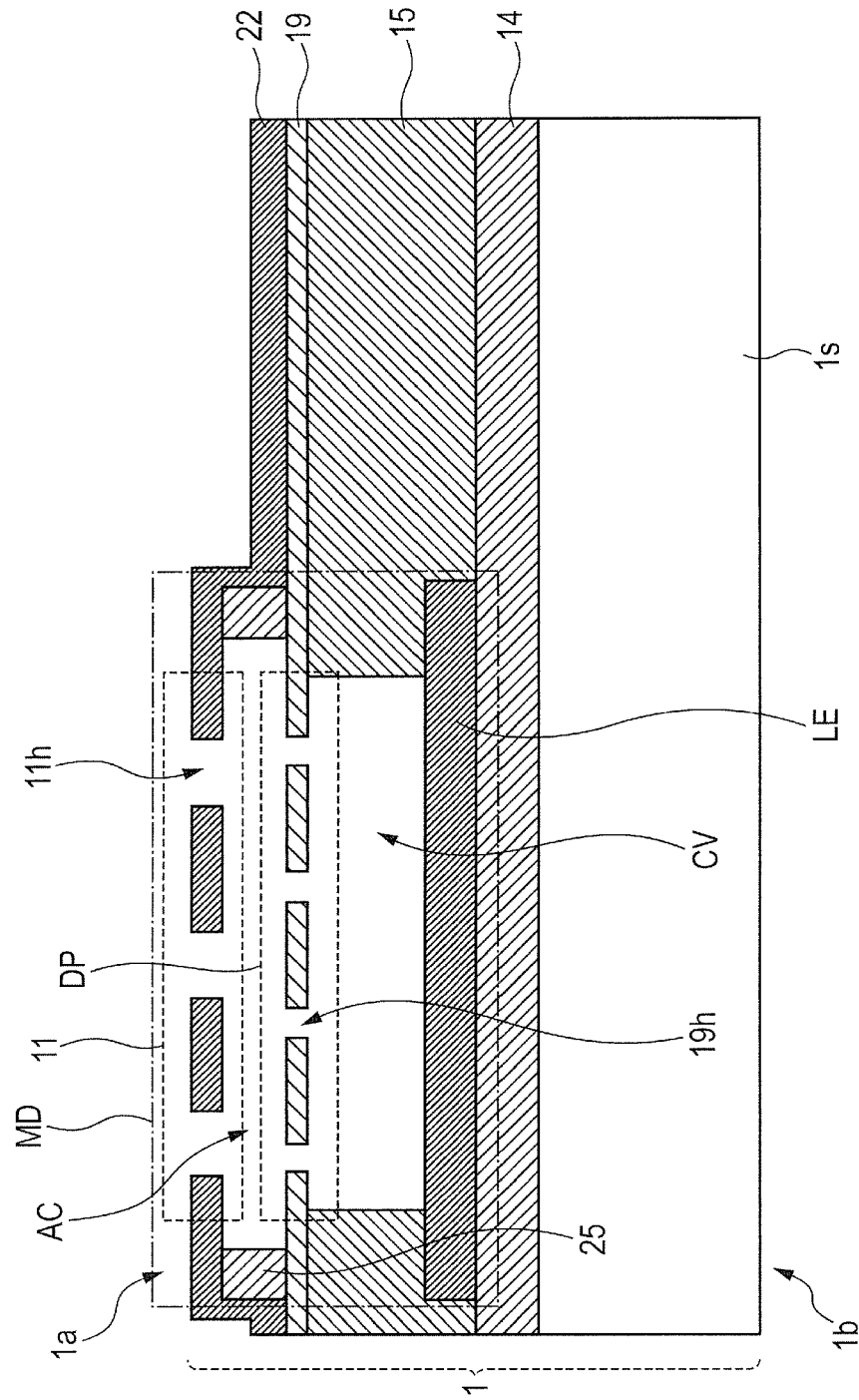
FIG. 9 is a device sectional view of a portion corresponding to FIG. 4 during the manufacturing process (step of removing a primary sacrificial insulating film)
Figure 10:
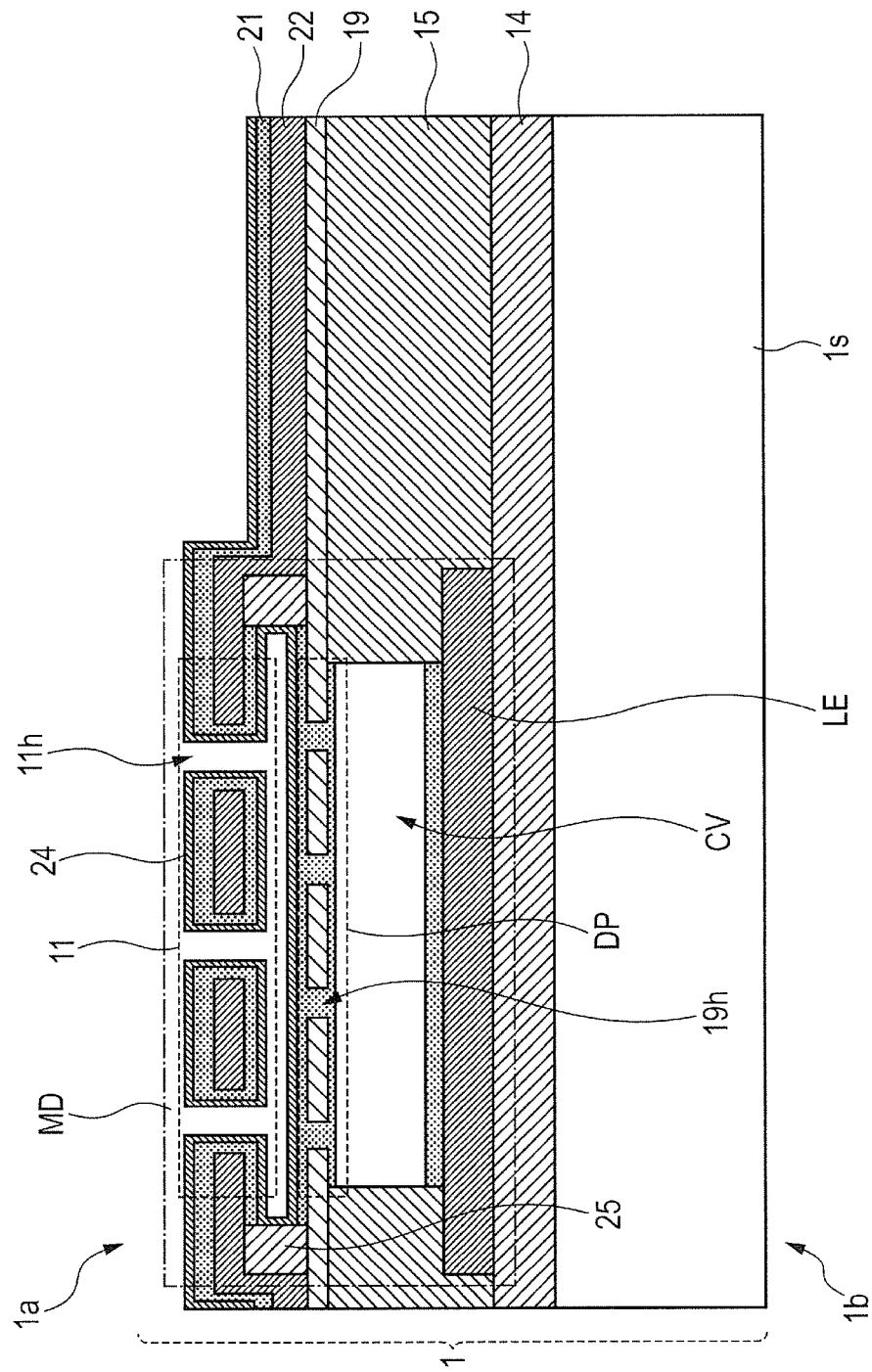
FIG. 10 is a device sectional view of a portion corresponding to FIG. 4 during the manufacturing process (primary backfilling step)
Figure 11:
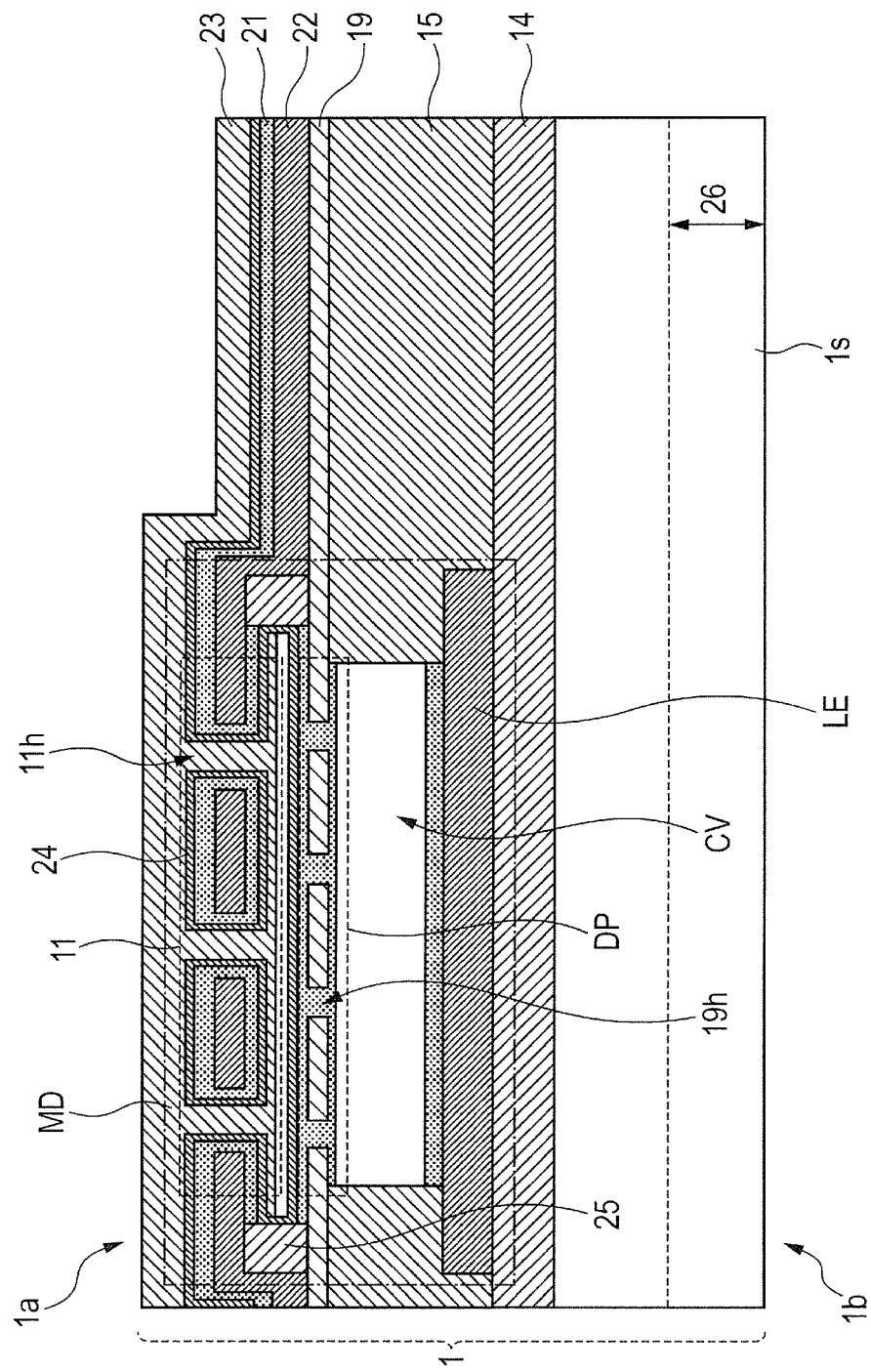
FIG. 11 is a device sectional view of a portion corresponding to FIG. 4 during the manufacturing process (secondary backfilling step)
Figure 12:
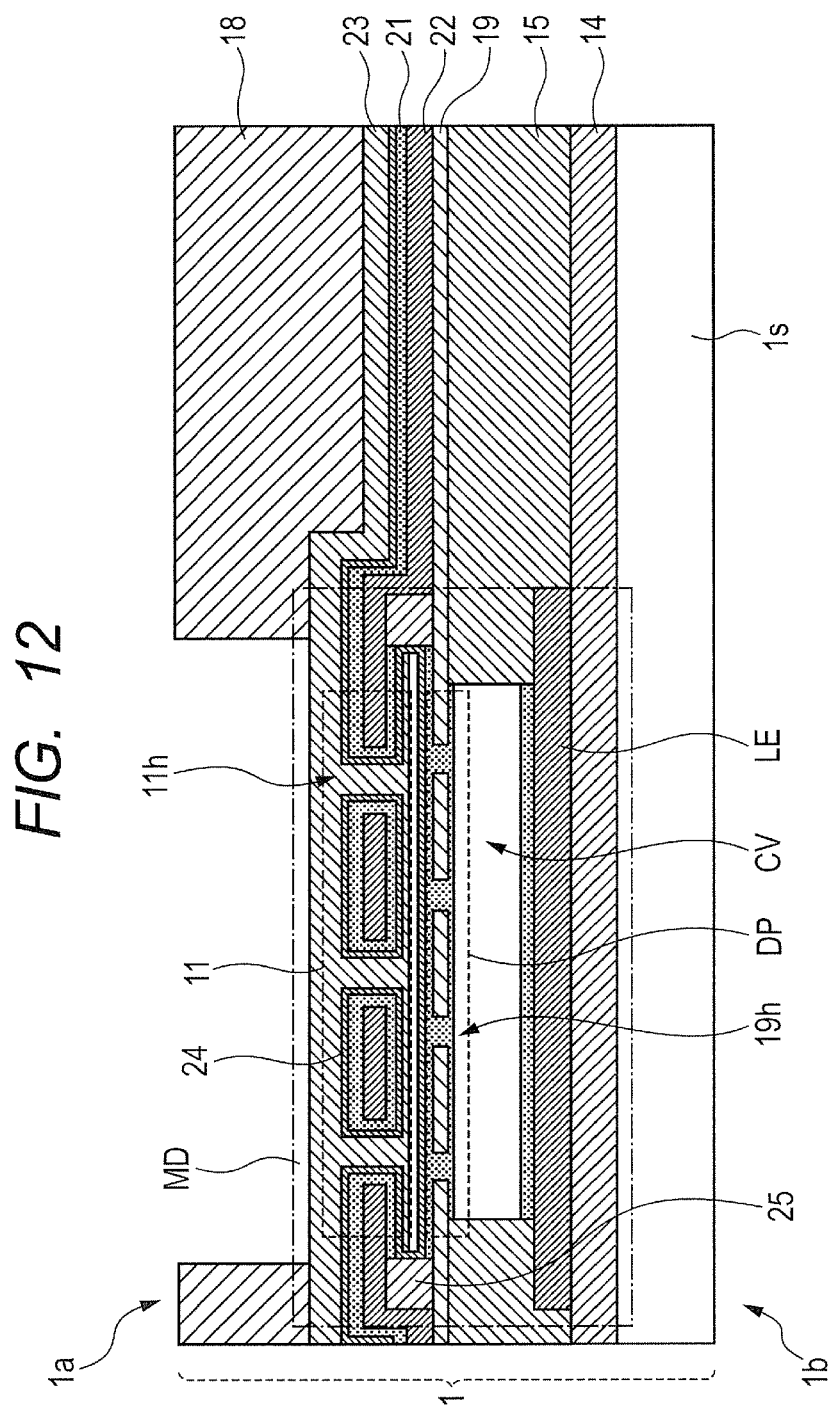
FIG. 12 is a device sectional view of a portion corresponding to FIG. 4 during the manufacturing process (step of processing a rewiring layer organic interlayer insulating film)
Figure 13:
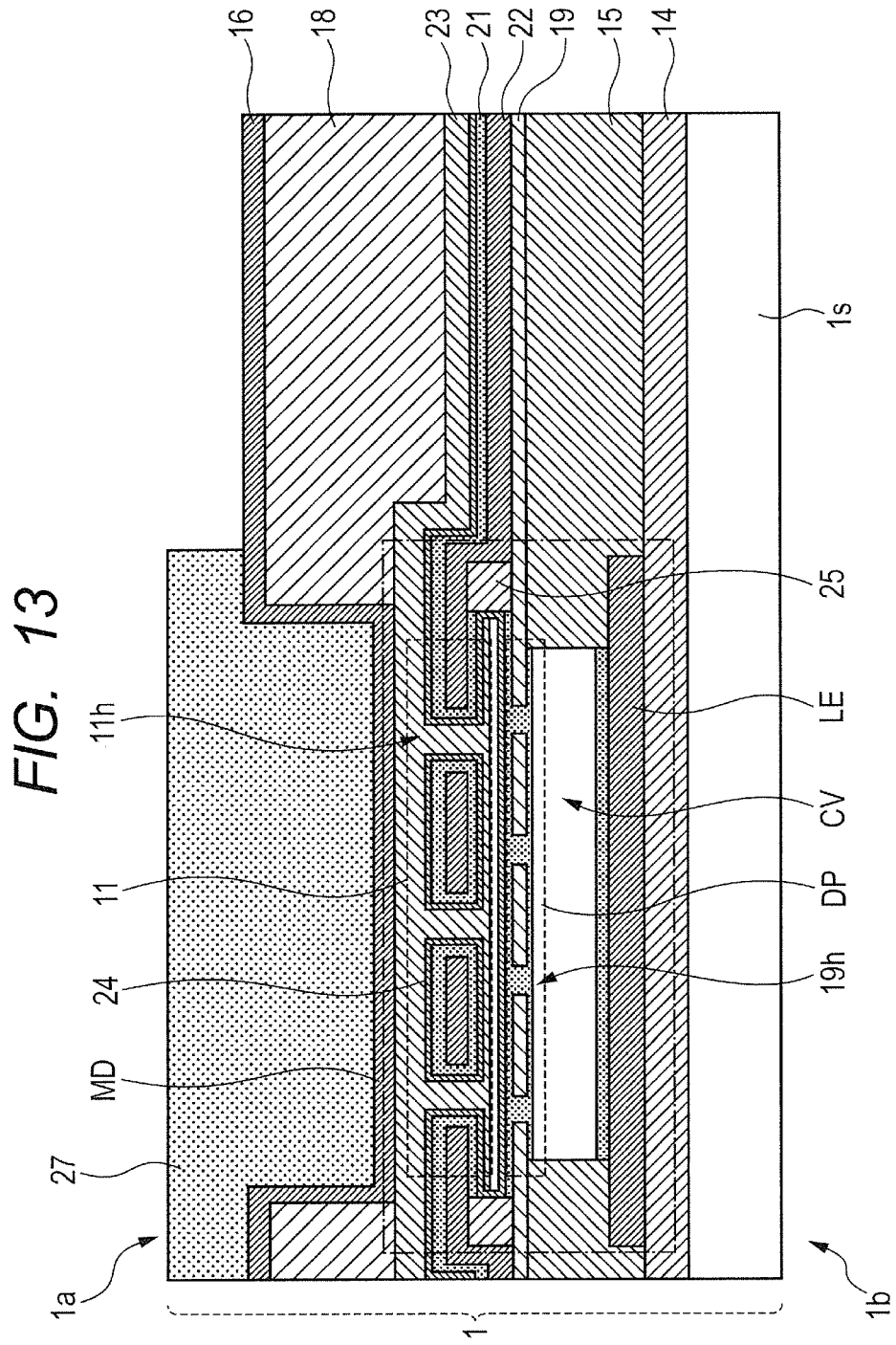
FIG. 13 is a device sectional view of a portion corresponding to FIG. 4 during the manufacturing process (step of processing a resist film for forming a rewiring)
Figure 14:
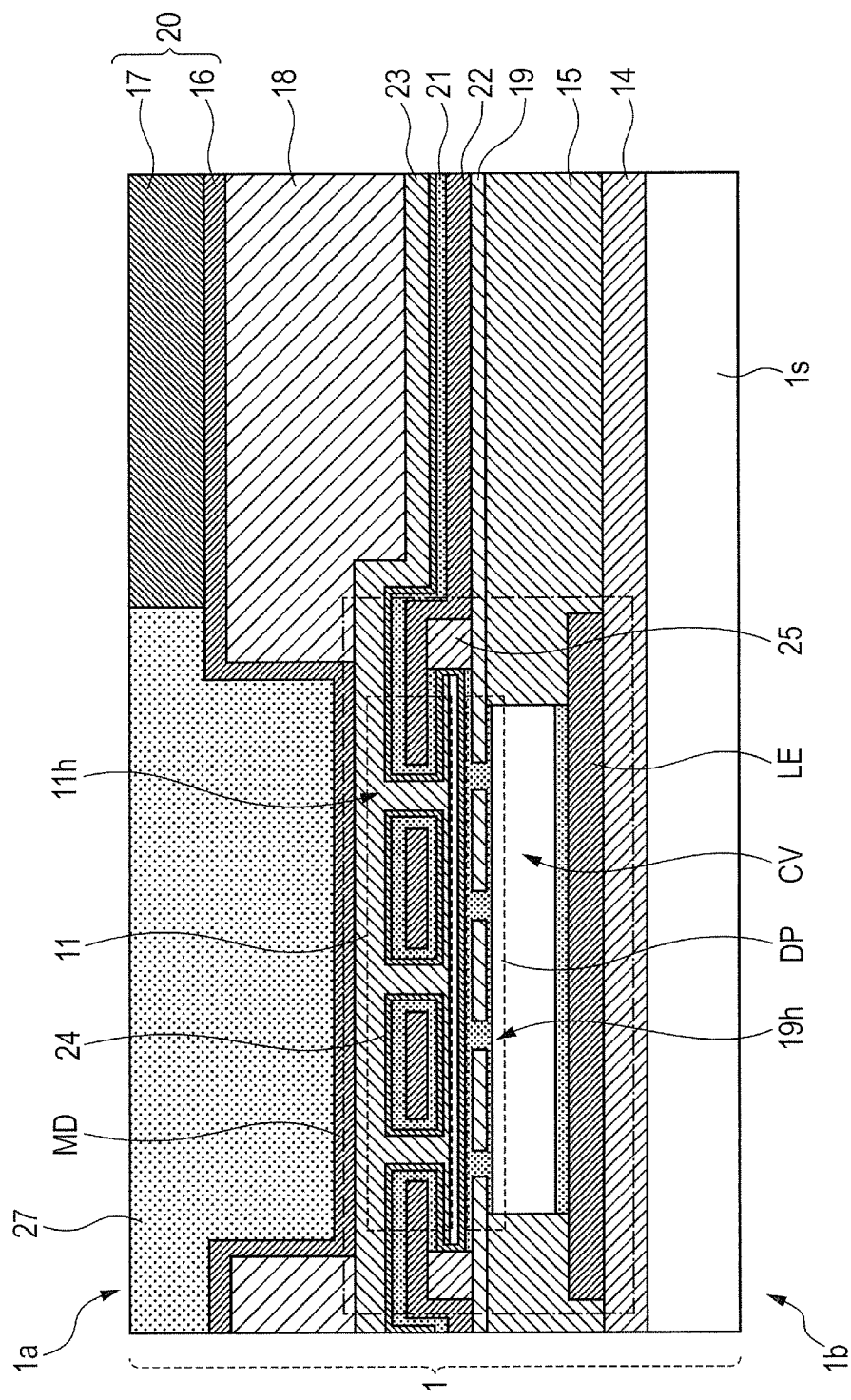
FIG. 14 is a device sectional view of a portion corresponding to FIG. 4 during the manufacturing process (step of forming a rewiring)
Figure 15:
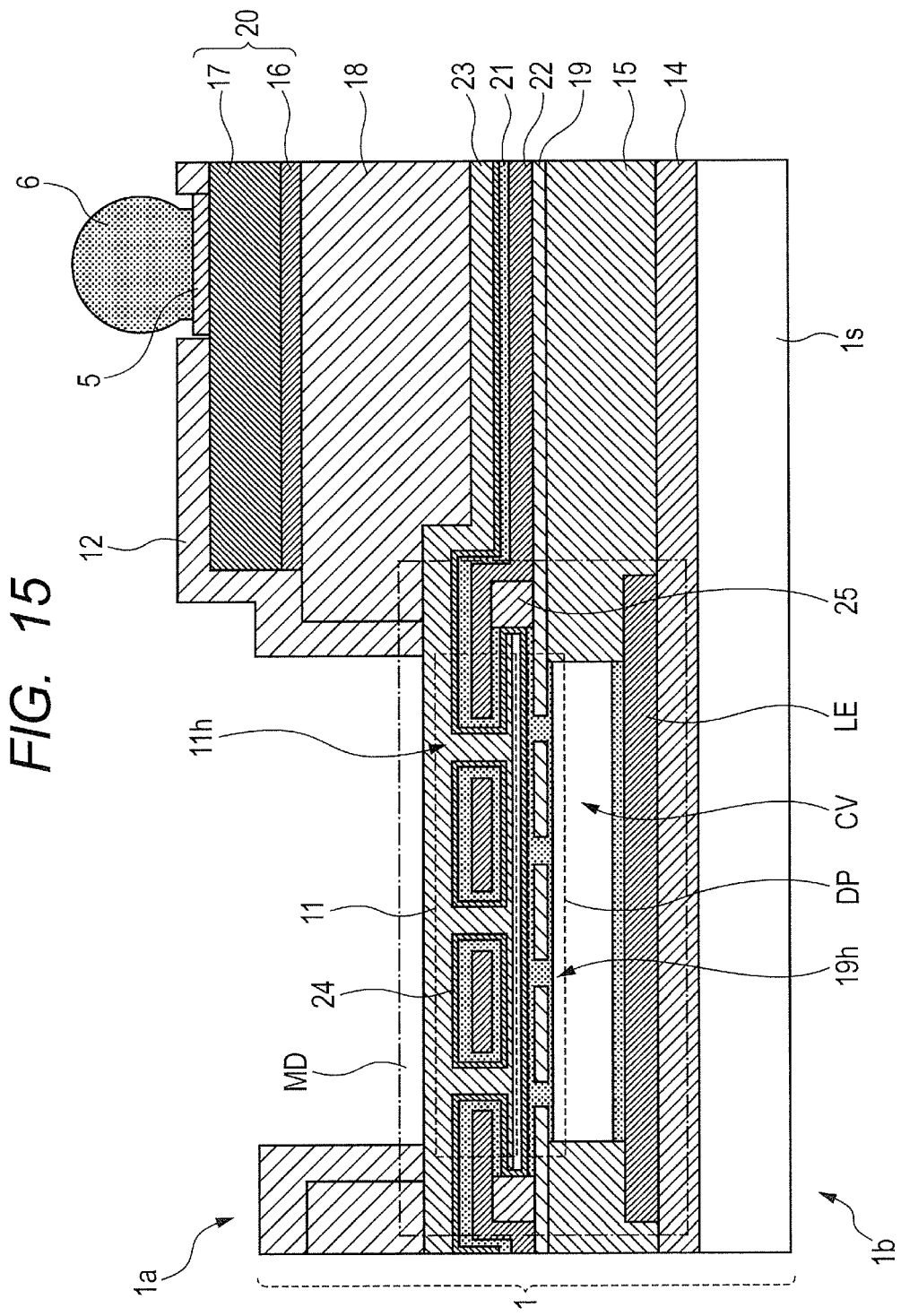
FIG. 15 is a device sectional view of a portion corresponding to FIG. 4 during the manufacturing process (step of forming a bump)
Figure 16:
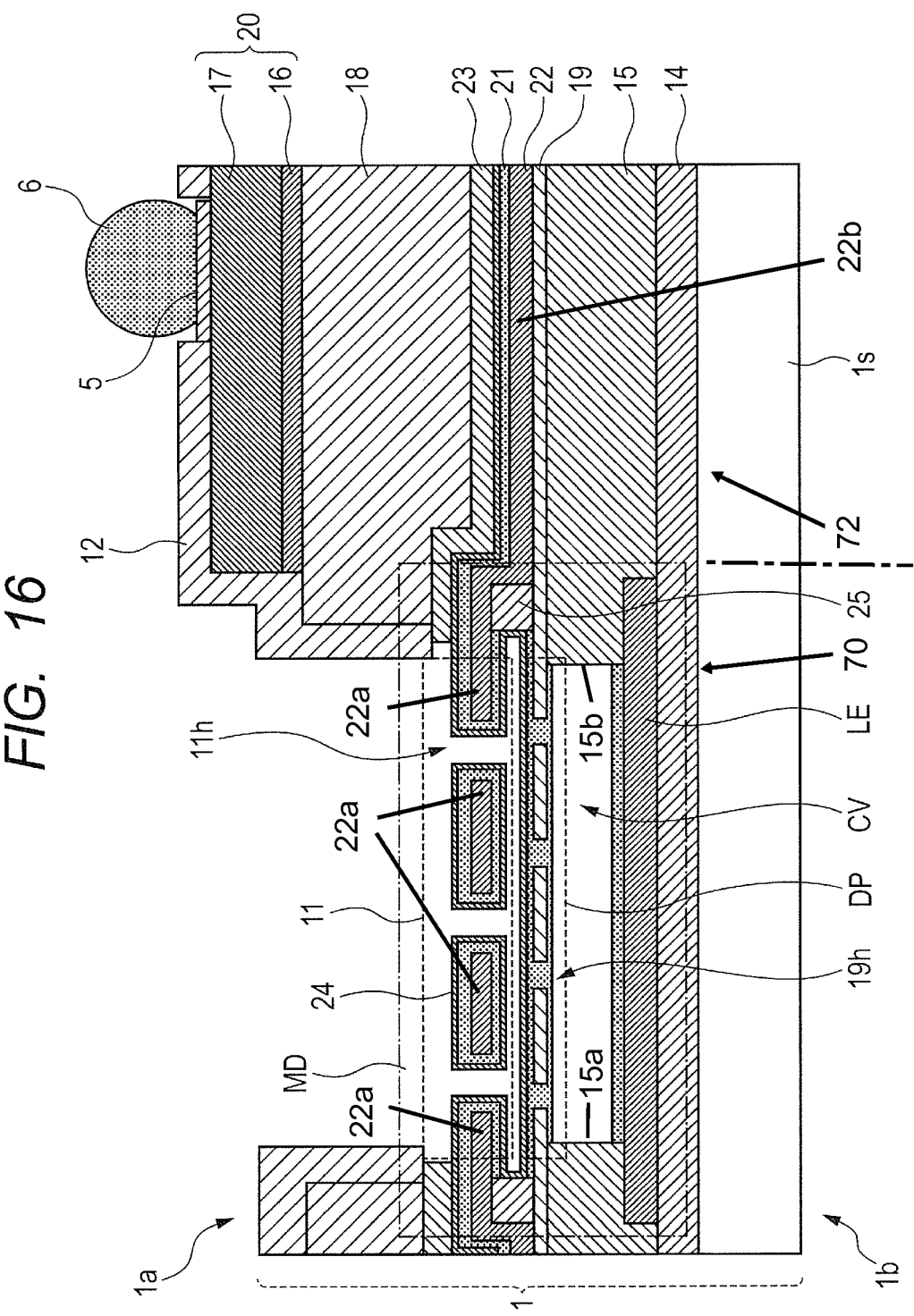
FIG. 16 is a device sectional view of a portion corresponding to FIG. 4 during the manufacturing process (step of removing a secondary sacrificial insulating film)

FIG. 5 is a process block flow chart for explaining the key process steps in the method of manufacturing a semiconductor integrated circuit device according to the above embodiment of the present invention. FIG. 6 is a top entire view of a wafer showing the state of the device surface of a wafer in the wafer process before the dicing step of FIG. 5. FIG. 7 is a device sectional view of a portion corresponding to FIG. 4 during the manufacturing process (step of making apertures in the diaphragm metal film). FIG. 8 is a device sectional view of the portion corresponding to FIG. 4 during the manufacturing process (step of making vents in the diaphragm cover). FIG. 9 is a device sectional view of the portion corresponding to FIG. 4 during the manufacturing process (step of removing a primary sacrificial insulating film). FIG. 10 is a device sectional view of the portion corresponding to FIG. 4 during the manufacturing process (primary backfilling step). FIG. 11 is a device sectional view of the portion corresponding to FIG. 4 during the manufacturing process (secondary backfilling step). FIG. 12 is a device sectional view of the portion corresponding to FIG. 4 during the manufacturing process (step of processing a rewiring layer organic interlayer insulating film). FIG. 13 is a device sectional view of the portion corresponding to FIG. 4 during the manufacturing process (step of processing a resist film for forming a rewiring). FIG. 14 is a device sectional view of the portion corresponding to FIG. 4 during the manufacturing process (step of forming a rewiring). FIG. 15 is a device sectional view of the portion corresponding to FIG. 4 during the manufacturing process (step of forming a bump). FIG. 16 is a device sectional view of the portion corresponding to FIG. 4 during the manufacturing process (step of removing a secondary sacrificial insulating film). The key process in the method of manufacturing a semiconductor integrated circuit device according to the above embodiment of the present invention will be explained with reference to these figures.

First of all, as shown in FIG. 5, a wafer is injected into the wafer process 100. A 300 mm P type monocrystal silicon wafer (the thickness of the wafer is arbitrary but preferably 500 to 1,000 μm) may be given as an example of the wafer. The size of the wafer may be 200 mm, 450 mm or others. When the FEOL step 101 proceeds, as shown in FIG. 6, a large number of semiconductor chips or chip regions 2 arranged in a matrix are formed over the device surface 1a of the wafer 1. Although this example is a wafer 1 having a notch 3, a wafer 1 having a crystal orientation indicator (for example, an orientation flat) may be used.

Then, as shown in FIG. 7, an over substrate insulating film 14 including a wiring layer is formed over the device surface 1a of the substrate is of the wafer 1 by carrying out the FEOL step 101 and the BEOL step 102 (including the wiring step 112). Thereafter, the lower electrode LE of the MEMS element MD is formed by processing a metal film of the same layer as the uppermost layer wiring of the wiring layer CW, that is, an aluminum-based metal film (for example, a laminated film containing Ti, TiN, Al and TiN layers from the bottom) in this example by ordinary lithography. A wiring uppermost layer insulating film 15 (for example, a plasma TEOS silicon oxide-based insulating film) is then formed over the over substrate insulating film 14 and the lower electrode LE by, for example, plasma CVD (Chemical Vapor Deposition). Then, a diaphragm metal film 19, for example, a tungsten film (thickness of, for example, 300 nm) is formed over the wiring uppermost layer insulating film 15 by sputtering. Thereafter, the diaphragm metal film 19 is patterned by ordinary lithography to form apertures 19h for the diaphragm type upper electrode DP. The diameter of each of the apertures 19h is preferably about 0.5 μm.

Thereafter, as shown in FIG. 8, a sacrificial silicon oxide film 25 (for example, a plasma TEOS silicon oxide-based insulating film having a thickness of about 1,000 nm) is formed over almost the entire device surface 1a of the wafer 1 by, for example, plasma CVD, and unwanted portions are removed by ordinary lithography. An inside plasma silicon nitride film 22 is then formed over almost the entire device surface 1a of the wafer 1 by, for example, plasma CVD. Thereafter, the inside plasma silicon nitride film 22 is patterned by ordinary lithography to remove unwanted portions, thereby forming vents 11h in the diaphragm cover 11. The diameter of each of the vents 11h is preferably 1.5 to 2.0 μm.

Thereafter, as shown in FIG. 9, the wiring uppermost layer insulating film 15 and the sacrificial silicon oxide film 25 above the lower electrode LE are etched by carrying out vapor-phase etching through the vents 11*h* and the apertures 19*h* to form a cavity CV and a cavity anterior chamber AC.

Thereafter, as shown in FIG. 10, a lower layer backfilling silicon oxide film 21 (for example, a plasma TEOS silicon oxide-based insulating film having a thickness of about 350 nm) is formed over almost the entire device surface 1*a* of the wafer 1 by, for example, plasma CVD to cover the top surface of the exposed lower electrode LE, the diaphragm metal film 19 and the inside plasma silicon nitride film 22 and fill the apertures 19*h*. Then, an outside plasma silicon nitride film 24 (thickness of, for example, about 100 nm) is formed over almost the entire device surface 1*a* of the wafer 1 by, for example, plasma CVD to cover the surface of the exposed lower layer backfilling silicon oxide film 21.

Thereafter, as shown in FIG. 11, an upper layer backfilling silicon oxide film 23 (for example, a plasma TEOS silicon oxide-based insulating film having a thickness of about 500 nm) is formed over almost the entire device surface 1*a* of the wafer 1 by, for example, plasma CVD to fill the vents 11*h*. This makes the difference between air pressures above and below the diaphragm type upper electrode DP constant, whereby the diaphragm type upper electrode DP does not move substantially, that is, the movable part (diaphragm type upper electrode DP) of the MEMS element MD is fixed (movable part fixing step 103 of FIG. 5). Thereafter, the back grinding of the rear surface 1*b* of the wafer 1 (for example, the removal of an area 26 to be removed by BG) is carried out while the device surface 1*a* of the wafer 1 is protected with a BG tape to reduce the thickness of the wafer to 10 to 200 μm (may be another value) (BG step 104*a* of FIG. 5). To reduce the thickness of the wafer 1 to 100 μm or less, the subsequent process is desirably carried out while a support member such as a glass sheet is affixed to the rear surface 1*b* of the wafer 1.

A description is subsequently given of the WLP (Wafer Level Packaging) step 105 of FIG. 5. As shown in FIG. 12, a photosensitive polyimide film (thickness of, for example, about 5 μm) is formed over almost the entire device surface 1*a* of the wafer 1 and patterned by ordinary lithography to remove a portion above the cavity CV so as to form a rewiring layer organic interlayer insulating film 18, while leaving the MEMS element MD exposed.

Thereafter, as shown in FIG. 13, a chromium film (thickness of, for example, about 100 nm) and a copper film (thickness of, for example, about 100 nm) are formed over almost the entire device surface 1*a* of the wafer 1 by sputtering to form a rewiring base metal film 16. Then, a resist film 27 for forming a rewiring is formed over the metal film 16 by ordinary lithography.

Thereafter, as shown in FIG. 14, a rewiring main metal film 17 is selectively formed over the rewiring base metal film 16 by electroplating (for example, copper plating having a thickness of about 3 μm and nickel plating having a thickness of about 2 μm from the bottom). Thereafter, the resist film 27 for forming a rewiring is totally removed by, for example, plasma ashing, and the rewiring base metal film 16 of an unwanted portion is removed by etching using the rewiring main metal film 17 as a mask in a self-alignment manner. This results in the appropriately sized rewiring metal film 20 which comprises the rewiring main metal film 17 over the rewiring base metal film 16.

Thereafter, as shown in FIG. 15, for example, a photosensitive polyimide film (thickness of, for example, about 2 μm) is formed over almost the entire device surface 1*a* of the wafer 1 and patterned by ordinary lithography to form an organic final passivation film 12 (the step up to here is the rewiring step 105*a* of FIG. 5). For example, sputtering and electroplating are repeated in the same manner as above after that to form an under bump electrode pad 5 (UBM). Then, a bump electrode 6 is formed over the under bump electrode pad 5 by, for example, electroplating or reflow (bump forming step 105*b* of FIG. 5). This completes the WLP step 105 of FIG. 5.

Thereafter, as shown in FIG. 5, the wafer testing step 107 is carried out as required. In this example, as shown in the route "a" of FIG. 5 from the wafer testing step 107, the dicing step 106*a* is then carried out (details thereof will be described hereinafter). The dicing step 106*a* may be carried out by full-cut dicing with a rotary blade which will be described hereinafter, laser dicing or a combination of laser grooving and dicing with a rotary blade (the same can be said of modifications).

Thereafter, as shown in FIG. 16, the upper layer backfilling silicon oxide film 23 above the cavity CV is removed by vapor-phase etching using the outside plasma silicon nitride film 24 as an etching stop in a self-alignment manner. This releases the movable part (diaphragm type upper electrode DP) of the MEMS element MD.

The structure resulting from the above-described manufacturing process is now explained with reference to the cross-section seen in FIG. 16. The result is a semiconductor integrated circuit device having a micro electro mechanical system (MEMS) element MD. In a cross-section of the device, the substrate is underlies a first region 70 in which the MEMS element MD is primarily formed, the substrate is also underlying a second region 72 in which the bump electrode 6 is primarily formed. In FIG. 16, the first and second regions 70, 72 are shown on opposites of an imaginary dashed line. The device includes a lower MEMS electrode LE formed in the first region 70, a wiring underlayer insulating film 15 formed on either side of the lower MEMS electrode MD and defining opposing sidewalls 15*a*, 15*b* of the cavity CV of the MEMS element MD, the wiring underlayer insulating film 15 extending into the second region 72, An upper MEMS electrode DP is spaced apart from the lower MEMS electrode LE and defines an upper wall of the cavity CV. The upper MEMS electrode DP comprises a first metal film 19 having spaced apart apertures 19*h* formed over the cavity CV, in the first region 70, and extending over the wiring underlayer insulating film 15, in the second region 72; and further comprises a first insulating film 21 covering the first metal film 19 and occupying the spaced apart apertures 19*h* formed therein, in the first region 70. The device further has: a diaphragm cover 11 formed over the upper MEMS electrode DP, in the first region; a rewiring layer 18 formed over the first metal film 19, in the second region 72; and a bump electrode 6 formed over the rewiring layer 18, in the second region 72.

The device also includes a rewiring metal film 20 formed between the rewiring layer 18 and the bump electrode 6, in the second region 72. The rewiring metal film 20 comprises a rewiring base metal film 16 formed over the rewiring layer 18, and a rewiring main metal film 17 formed over the rewiring base metal film 16; and a passivation layer 12 covers at least a portion of the rewiring main metal film 17.

In the device, the first insulating film 21 also covers a top surface of the lower MEMS electrode LE within the cavity CV, in the first region 70.

Also, the diaphragm cover 11 comprises a first nitride film 22 having a first portion 22*a* provided with vents 11*h*, in the first region 70; the first nitride film 22 has a second portion 22*b* extending over the first metal film 19, in the second region 72; and the first portion 22*a* is stepped higher relative to the second portion 22*b*.

The diaphragm cover 11 further comprises a second nitride film 24 covering the first nitride film 22, in the first region, and the first insulating film 21 is interposed between the first nitride film 22 and the second nitride film 24, in the first region 70.

The second nitride film 24 also covers the first insulating film 21 of the upper MEMS electrode DP.

And in the second region 72, the first nitride film 22 is formed over the first metal film 19; the first insulating film 21 is formed over the first nitride film 22; the second nitride film 24 is formed over the first insulating film 21; a second insulating film 23 is formed over the second nitride film 24; and the rewiring layer 18 is formed over the second insulating film 23.

The step from the injection of the wafer to the release of the movable part is the MEMS element forming step 300 of FIG. 5.

Thereafter, as shown in FIG. 5, the die bonding step 201 which belongs to the chip process 200 is carried out on the wafer 1.

Section 3. Detailed Description of Process for Removing Sacrificial Silicon Oxide Film (Sacrificial Insulating Film or Sacrificial Film) in the Manufacturing of a Semiconductor Integrated Circuit Device According to the Above Embodiment of the Present Invention (Mainly from FIG. 17 to FIG. 19)

A detailed description is given of the removal process of the sacrificial silicon oxide film in FIG. 9 and FIG. 16 in this section. A case in which hydrogen fluoride-based vapor-phase etching is employed will be described herein as an example, and it is needless to say that the sacrificial insulating film (generally a sacrificial film) may be removed by not only non-plasma vapor-phase etching described herein but also plasma vapor-phase etching (that is, dry etching) or wet etching. When non-plasma vapor-phase etching is used, it has advantages such as no plasma damage and also no problem with stiction.

Figure 19:
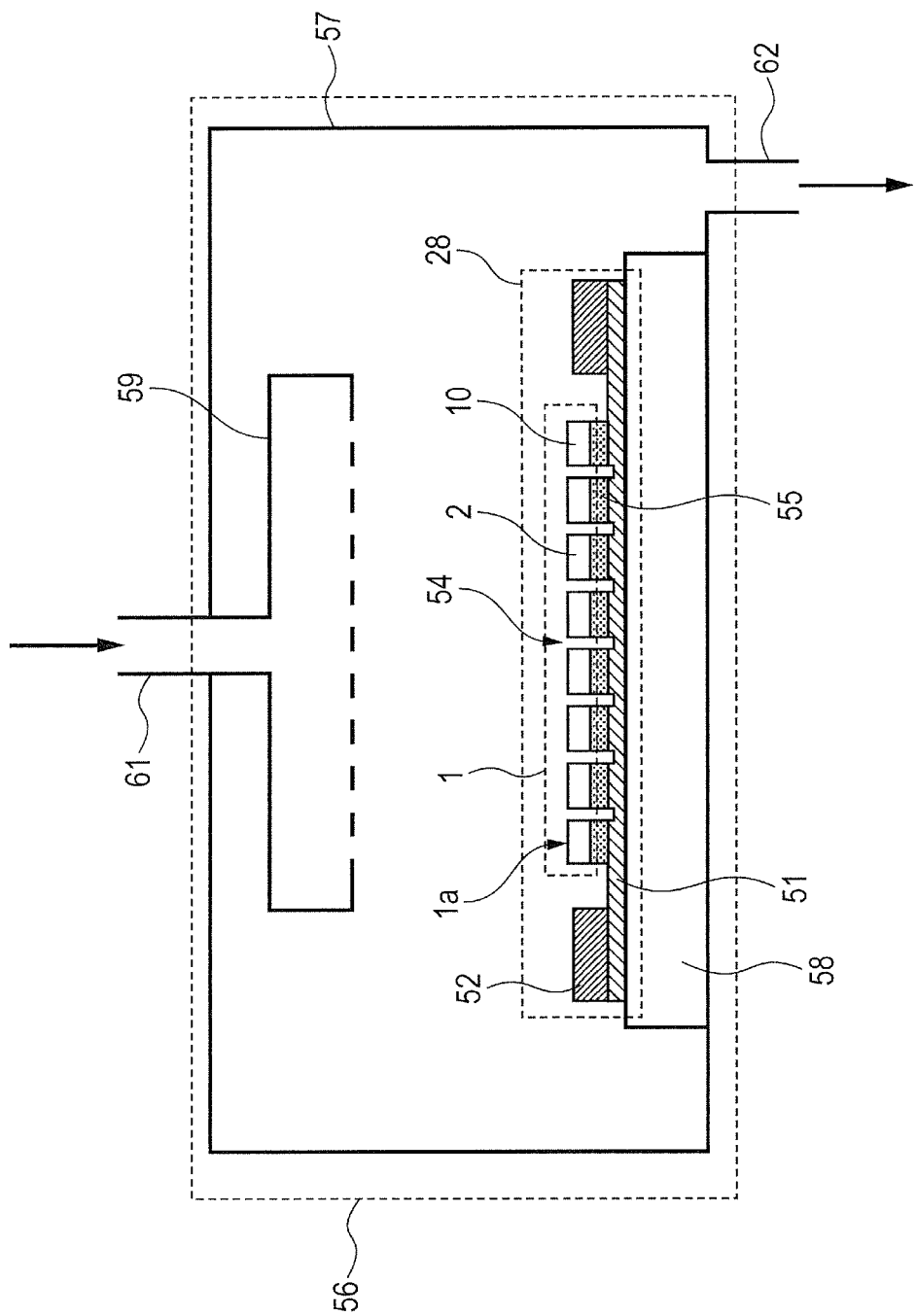
FIG. 19 is a sectional view of the processing chamber of a gas-phase etching apparatus used in the step of removing a sacrificial insulating film.

Since a wafer & frame composite 28 in FIG. 19 is used in place of the wafer 1 itself (the direction of the wafer is the same) in the removal process of the sacrificial silicon oxide film in FIG. 9, the process will be explained mainly for the wafer of FIG. 16.

Figure 17:
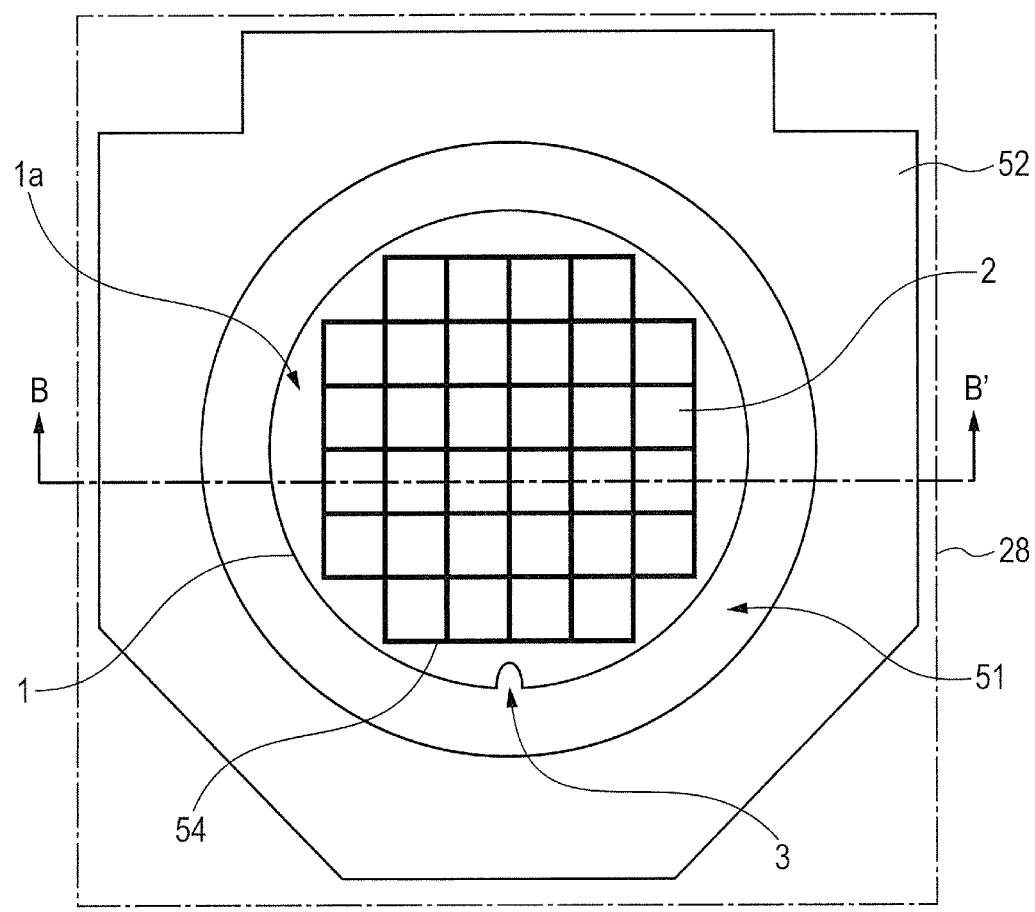
FIG. 17 is a top entire view of a wafer & dicing frame composite for explaining details of a process for removing a sacrificial silicon oxide film (sacrificial insulating film or sacrificial film) in the manufacturing of a semiconductor integrated circuit device according to the above embodiment of the present invention.
Figure 18:
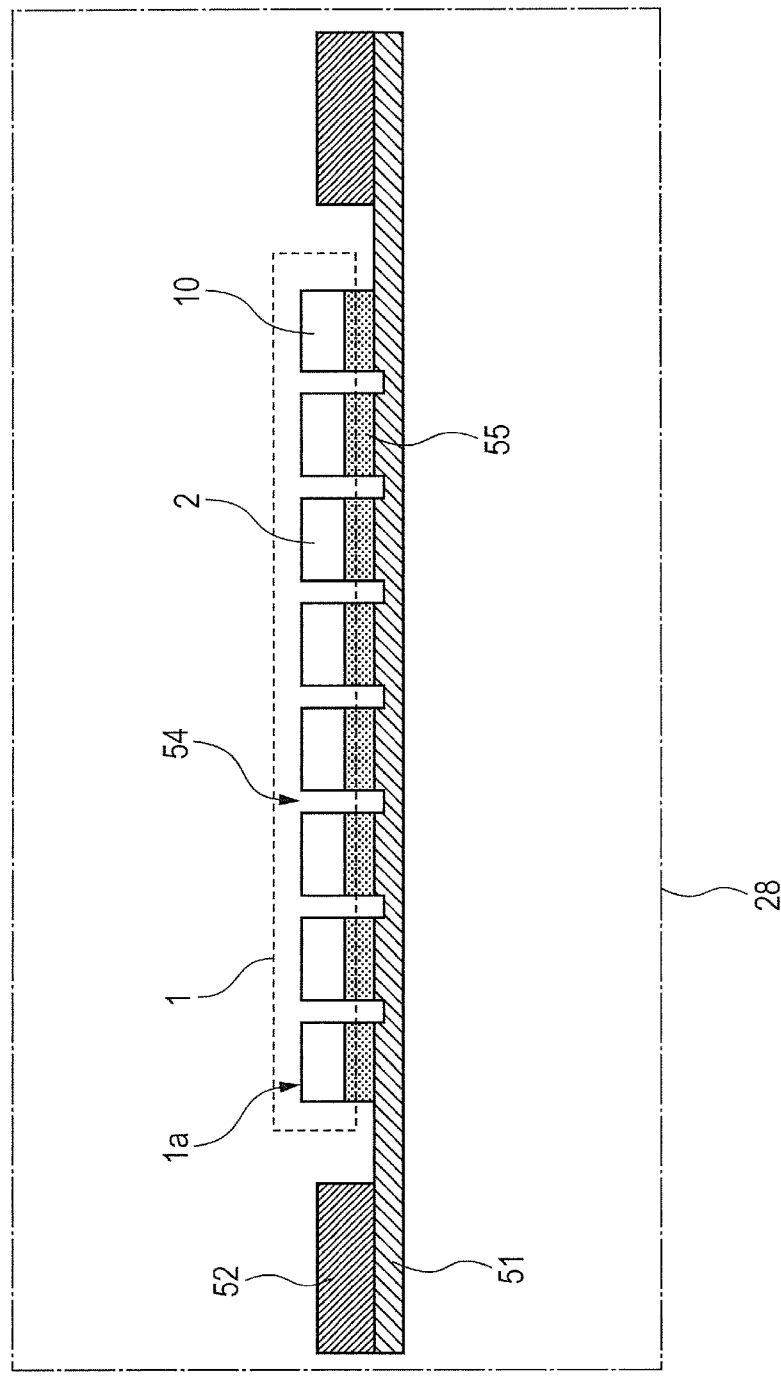
FIG. 18 is a sectional view of the wafer & dicing frame composite taken on line B-B' of FIG. 17.

FIG. 17 is a top entire view of the wafer & dicing frame composite for explaining details of the process for removing the sacrificial silicon oxide film (sacrificial insulating film or sacrificial film) in the manufacturing of a semiconductor integrated circuit device according to the above embodiment of the present invention. FIG. 18 is a sectional view of the wafer & dicing frame composite taken on line B-B' of FIG. 17. FIG. 19 is a sectional view of the processing chamber of a vapor-phase etching apparatus used in the step of removing a sacrificial insulating film. A detailed description is given of the process for removing a sacrificial silicon oxide film (sacrificial insulating film or sacrificial film) in the manufacturing of a semiconductor integrated circuit device according to the above embodiment of the present invention with reference to these figures.

The state of the wafer 1 or the wafer & frame composite 28 when the dicing step 106a of FIG. 5 is completed is shown in FIG. 17 and FIG. 18. As shown in FIG. 17 and FIG. 18, at this point, the wafer 1 has been fully cut (dicing grooves reach a dicing tape through the wafer 1 and a die attach film 55), and chip regions 2 over the wafer 1 are separated from one another physically with dicing grooves 54 therebetween. However, the mutual relationship between chips arranged in a matrix is unchanged Euclidean plane geometrically. That is, the wafer 1 is affixed to the dicing tape 51 through the rear surface 1b (further through DAF or the die attach film in this example) before and after dicing, and the periphery of the dicing tape 51 is fixed by a dicing frame 52, thereby forming the wafer & frame composite 28 as an integral body. Therefore, the step of processing the wafer 1 of the wafer & frame composite 28 can be classified as the wafer process 100. This is because the wafer 1 can be processed as a unit through the wafer & frame composite 28. In contrast to this, as the die bonding step 201 in FIG. 5 is carried out by separating the chips 2 from one another or on each chip 2 though it is made on the wafer & frame composite 28, it can be classified as the chip process 200.

A brief description of a specific vapor-phase etching apparatus 56 and a description of a sacrificial film etching process using the apparatus are subsequently given. A brief description is first given of the vapor-phase etching apparatus 56. As shown in FIG. 19, the key portion of the vapor-phase etching apparatus 56 is a processing chamber 57, and a wafer stage 58 (a stage on which the wafer 1 or the wafer & frame composite 28 is set) is provided at the bottom of the processing chamber 57. At the time of processing, the wafer 1 or the wafer & frame composite 28 (in the case of FIG. 16) is set on this wafer stage 58 while the device surface 1a faces up.

A shower head 59 is installed in an upper part of the processing chamber 57 to supply a processing gas through a gas introduction port 61. The processing gas is exhausted by an exhaust system through a gas exhaust port 62 formed in, for example, a bottom part of the processing chamber 57.

More specifically, etching is carried out as follows. That is, etching is preferably carried out at normal pressure (or reduced pressure as required) as a processing pressure and a stage temperature of 40 to 100° C. (desirably 60 to 80° C.) by using a processing gas such as a mixed gas of anhydrous HF and $CH_3OH$ for a processing time of 10 to 20 minutes.

The processing gas for removing the sacrificial oxide film may be a gas containing hydrofluoric acid steam as one of the main components in addition to anhydrous HF. The additive gas (vapor) is a volatile gas such as an alcohol other than the above-mentioned $CH_3OH$ and preferably an organic solvent which does not attack polyimide. An additive gas such as $CH_3OH$ is not essential.

Section 4. Explanation of Modifications of the Key Process in the Method of Manufacturing a Semiconductor Integrated Circuit Device According to the Above Embodiment of the Present Invention (Mainly FIG. 20)

Modifications of the process shown from FIG. 7 to FIG. 16 and described in Section 2 above are explained in this section. The difference between them is only what is shown in FIG. 11 and FIG. 15, and only different parts will be explained hereinbelow.

Figure 20:
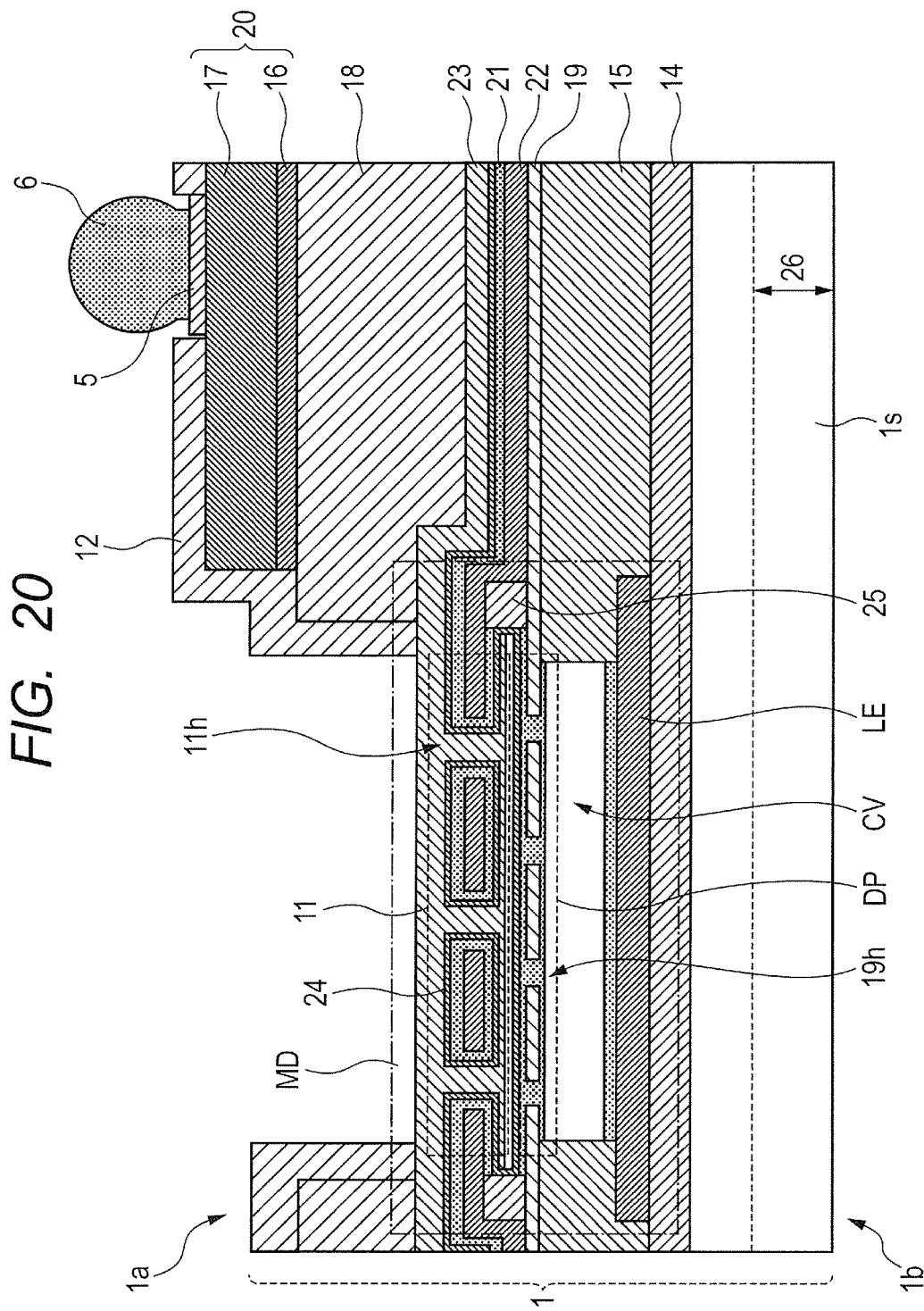
FIG. 20 is a device sectional view of a portion corresponding to FIG. 15 for explaining a modification of the key process in the method of manufacturing a semiconductor integrated circuit device according to the above embodiment of the present invention (step of forming a bump).

FIG. 20 is a device sectional view corresponding to FIG. 15 for the explanation of modifications of the key process in the method of manufacturing a semiconductor integrated circuit device according to the above embodiment of the present invention (bump forming step). Modifications of the key process in the method of manufacturing a semiconductor integrated circuit device according to the above embodiment of the present invention will be described with reference to this figure.

(1) First Modification of BG Timing (Sequence) in the BG Precedence Process (Route "b" from the Movable Part Fixing Step 103 and the Wafer Testing Step 107 in FIG. 5, and FIG. 20):

In the example of Section 2 above, the BG step is carried out in FIG. 11. The BG process in the first modification is similar to BG process described in Section 2 above, but differs in that the BG step is carried out in FIG. 15. The BG precedence process, like in the process described above in Section 2, has an advantage that it is preferred for the use of DAF (die attach film). As compared with the modification of the subsection (2) below of this section, the BG process of first modification has an advantage that the dicing step becomes relatively easy. Further, like the second modification of subsection (2) below, the first modification of this subsection (1) has an advantage that the WLP step 105 and the wafer testing step 107 can be carried out while the wafer 1 is thick.

In contrast to this, the process of the section 2 has an advantage that the wafer testing step 107 can be carried out while the wafer is thin, which is almost close to an actually used state.

(2) Second Modification of BG Timing in the Dicing Precedence Process (Route "c" from the Movable Part Fixing Step 103 and the Wafer Testing Step 107 of FIG. 5, and FIG. 20):

This is a further modification of the process described in subsection (1) above and is characterized in that the dicing precedence process is employed before the BG precedence process. This is advantageous when the number of chippings is small in the dicing precedence process. The present second modification of this subsection has an advantage that the WLP step 105, the wafer testing step 107 and the dicing step 106c can be all be carried out while the wafer 1 is still thick, i.e., before any BG.

In the dicing precedence process, as shown in FIG. 5, half dicing is carried out in the dicing step 106c to keep the chip areas 2 coupled to one another in the wafer 1. Thereafter, the back grinding of the rear surface 1b of the wafer 1 is carried out while the device surface 1a of the wafer 1 is protected by a BG tape, thereby dividing the wafer 1 into individual chips. Then, like other examples, while the rear surface 1b of the wafer 1 is affixed to an adhesive tape similar to the dicing tape so as to be fixed to a similar frame to the dicing frame, the movable part releasing step 120 and the die bonding step 201 are carried out.

Section 5. Complementary Explanation of the Above Embodiment (Including Modifications) and Consideration of the Whole (Mainly Refer to FIG. 5)

In the above embodiments, the main part of the MEMS element forming step 300 shown in FIG. 5 (part excluding the movable part fixing step 103 and the movable part releasing step 120) is carried out in part or an extended part of the BEOL step 102 (or part of the WLP step 105). However, according to the attributes of the MEMS element region 9, part of the FEOL step 101 or the WLP step 105 can be made part of the key part of the MEMS element forming step 300.

Since the movable part of the MEMS element MD is fixed before the BG step 104a in the example of Section 2 above, an adverse effect on the MEMS element MD by the WLP step 105 can be avoided. Further, since the movable part of the MEMS element MD is released in the dicing step 106a in the example of Section 2, the influence of vibration caused by the dicing step 106a can be avoided.

Since the movable part of the MEMS element MD is released in the wafer process 100 in the example of Section 2 (the same as in the modifications), the processing efficiency can be greatly improved.

6. Summary

While preferred embodiments of the invention which was made by the inventors of the present invention have been described above, it is needless to say that the present invention is not limited thereto but may be variously modified without departing from the spirit and the scope of the invention.

For instance, while a silicon-based LSI is taken as an example in the above embodiments, it is needless to say that the present invention is not limited thereto and can be applied to silicon-based semiconductor devices, compound semiconductor integrated circuit devices or semiconductor devices.

What is claimed is:

1. A method of manufacturing a semiconductor integrated circuit device having a micro electro mechanical system (MEMS) element, comprising the steps of:
    (a) forming a wiring layer and a MEMS element having a movable part over a first main surface of a semiconductor wafer having the first main surface and a second main surface;
    (b) fixing the movable part of the MEMS element;
    (c) after the step (b), forming a rewiring layer over the wiring layer over the first main surface of the semiconductor wafer while the movable part of the MEMS element is fixed;
    (d) after the step (c), dicing the semiconductor wafer while the movable part of the MEMS element is fixed; and
    (e) after the step (d), releasing the movable part of the MEMS element by etching the first main surface of the semiconductor wafer.

2. The method according to claim 1, wherein the step (d) is carried out while the second main surface of the semiconductor wafer is affixed to a dicing tape.

3. The method according to claim 2, wherein the step (e) is carried out while the second main surface of the semiconductor wafer is affixed to a dicing tape.

4. The method according to claim 3, wherein the MEMS element is an air pressure sensor.

5. The method according to claim 4, wherein the MEMS element is formed to have:
    (x1) a lower electrode formed over the first main surface of the semiconductor wafer;
    (x2) a cavity formed over the lower electrode;
    (x3) a diaphragm type upper electrode formed to cover the cavity over the first main surface of the semiconductor wafer; and
    (x4) a diaphragm cover for isolating the diaphragm type upper electrode from the outside world.

6. The method according to claim 5, wherein the step (b) is carried out by covering vents formed in the diaphragm cover with a protective film.

7. The method according to claim 6, wherein the step (e) is carried out by opening the vents formed in the diaphragm cover.

8. The method according to claim 7, comprising opening the vents by etching the protective film over the first main surface of the semiconductor wafer while the second main surface of the semiconductor wafer is affixed to the dicing tape.

9. The method according to claim 8, further comprising the step of:
    (f) after the step (b) and before the step (c), grinding the second main surface of the semiconductor wafer.

10. The method according to claim 8, further comprising the step of:
    (g) after the step (c) and before the step (e), grinding the second main surface of the semiconductor wafer.

* * * * *